US006787459B2

(12) United States Patent
Moniwa et al.

(10) Patent No.: US 6,787,459 B2
(45) Date of Patent: Sep. 7, 2004

(54) METHOD FOR FABRICATING A SEMICONDUCTOR DEVICE

(75) Inventors: Akemi Moniwa, Sayama (JP); Takuya Hagiwara, Tsukuba (JP); Keitaro Katabuchi, Ome (JP); Hiroshi Fukuda, Kodaira (JP); Mineko Adachi, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/294,700

(22) Filed: Nov. 15, 2002

(65) Prior Publication Data

US 2003/0106037 A1 Jun. 5, 2003

(30) Foreign Application Priority Data

Dec. 3, 2001 (JP) .......................................... 2001-368077

(51) Int. Cl.[7] .......................... H01C 21/44; G06F 17/50; G03F 9/00
(52) U.S. Cl. ......................... 438/671; 438/118; 438/6; 438/238; 438/253; 438/622; 438/629; 438/942; 716/19; 716/20; 430/5; 430/30; 430/311
(58) Field of Search ................................. 438/671, 198, 438/6, 238, 253, 622, 629, 942, 946; 716/19, 20; 430/5, 30, 311

(56) References Cited

U.S. PATENT DOCUMENTS 5,858,580 A 1/1999 Wang et al.
6,391,501 B1 * 5/2002 Ohnuma ....................... 430/22
6,660,462 B1 * 12/2003 Fukuda ....................... 430/394
6,664,010 B2 * 12/2003 Ahrens et al. ................. 430/5
6,733,929 B2 * 5/2004 Pierrat .......................... 430/5
2002/0094492 A1 * 7/2002 Randall et al. ............. 430/311

FOREIGN PATENT DOCUMENTS

| JP | 2650962 | 5/1988 |
| JP | 3148770 | 3/1992 |
| JP | 6-308714 | 4/1993 |

OTHER PUBLICATIONS

Christopher Spence, et als., "Integration of Optical Proximity Correction Strategies in Strong Phase Shifters Design for Poly–Gate Layers", Proceedings of SPIE, vol. 3873, 2000, pp277–287.

Frank Schellenberg, et als. "OPC beyond 0.18 um: OPC on PSM Gates", Proceedings of SPIE, vol. 4000 (2000) pp1062–1069.

* cited by examiner

Primary Examiner—Matthew Smith
Assistant Examiner—Igwe U. Anya
(74) Attorney, Agent, or Firm—Reed Smith LLP; Stanley P. Fisher, Esq.; Juan Carlos A. Marquez, Esq.

(57) ABSTRACT

There is provided a method of fabricating a semiconductor device whereby fine patterns are formed with high dimensional accuracy by means of multiple exposures, using a phase shift mask and a trim mask. Phases are periodically assigned to shifter patterns within a given range from patterns generated with the phase shift mask, respectively.

16 Claims, 20 Drawing Sheets

LAYOUT PATTERN  PHASE-SHIFT PATTERN  TRIM PATTERN

LAYOUT PATTERN  PHASE-SHIFT PATTERN  TRIM PATTERN

FIG.3A 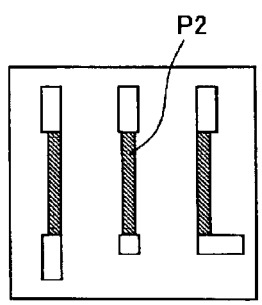 FIG.3B 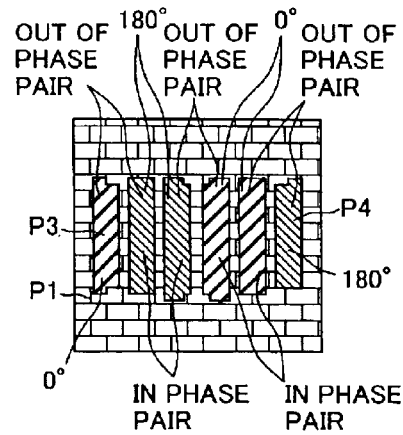 FIG.3C 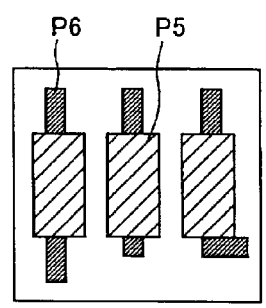
LAYOUT PATTERN  PHASE-SHIFT PATTERN  TRIM PATTERN
FIG.4
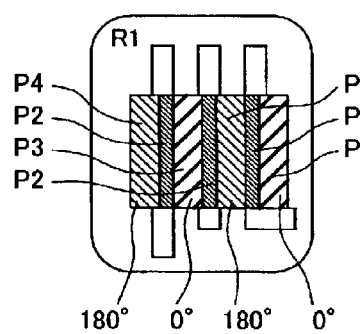 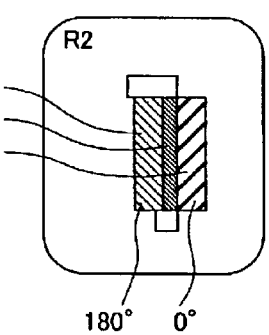

LAYOUT PATTERN

PATTERN IMAGED WITH SHIFTER EDGE

APERTURE PATTERN FOR PHASE SHIFT PATTERN

APERTURE PATTERN FOR DUMMY SHIFTER PATTERN

DUMMY GATE PATTERN

SHIFTER PATTERN AFTER PHASE ASSIGNMENT

PROTECTION PATTERN

PATTERN IMAGED WITH
TRIM PATTERN

TRIM PATTERN

LAYOUT PATTERN

APERTURE PATTERN FORMED
SHIFTER AND DUMMY SHIFTER,
AND DUMMY GATE PATTERN

SHIFTER PATTERN AFTER
PHASE ASSIGNMENT

REAL SHIFTER PATTERN P7 PAIRS WHICH PLACED BOTH SIDES OF PATTERN P2

REAL SHIFTER PATTERN P7 PAIRS PLACED BOTH SIDES OF DUMMY GATE PATTERN P9

REAL SHIFTER PATTTERN P7 AND DUMMY SHIFTER PATTERN P8 PAIRS PLACED OF BOTH SIDES OF DUMMY GATE PATTERN P9

DUMMY SHIFTER P8 PAIRS PLACED AT BOTH SIDES OF DUMMY GATE PATTERN P9

FIG.11

PROXIMITY CORRECTION RELATED TO
EXPOSURE WITH PHASE SHIFT MASK

| | BIAS CORRECTION VALUE FOR $400 \leq a < 500$ | BIAS CORRECTION VALUE FOR $500 \leq a < 900$ |
|---|---|---|
| $500 \leq b < 700$ | 10nm | 5nm |
| $700 \leq b < 800$ | 7nm | 3nm |
| $800 \leq b$ | 0nm | 0nm |

P10 AND P11 ARE OUT OF PHASE

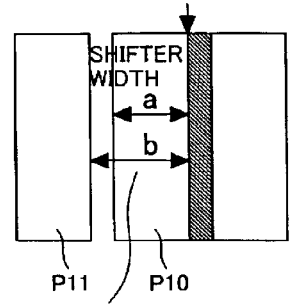

BIAS CORRECTION EDGE AT OPAQUE AREA BETWEEN SHIFTER PATTERNS

SHIFTER WIDTH a b

P11   P10

DISTANCE BETWEEN BIAS CORRECTION EDGE AND ADJACENT SHIFTER PATTERN

FIG.12

PROXIMITY CORRECTION RELATED TO
EXPOSURE WITH TRIM MASK

| | BIAS CORRECTION VALUE AT OPAQUE AREA BETWEEN SHIFTER PATTERNS |
|---|---|
| $300 \leq c < 360$ | −15nm |
| $360 \leq c < 460$ | −18nm |
| $460 \leq c < 500$ | −22nm |

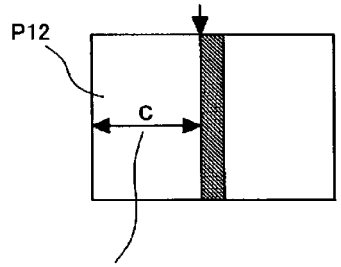

BIAS CORRECTION EDGE AT OPAQUE AREA BETWEEN SHIFTER PATTERNS

P12 c

DISTANCE BETWEEN BIAS CORRECTION EDGE AND TRIM EDGE

FIG.13

PROXIMITY CORRECTION RELATED TO MICRO-LOADING EFFECT OF ETCHING PROCESS

|  | BIAS CORRECTION VALUE AT OPAQUE AREA BETWEEN SHIFTER PATTERNS |
|---|---|
| $500 \leq d < 1000$ | -10nm |
| $1000 \leq d < 1500$ | -6nm |
| $1500 \leq d$ | 0nm |

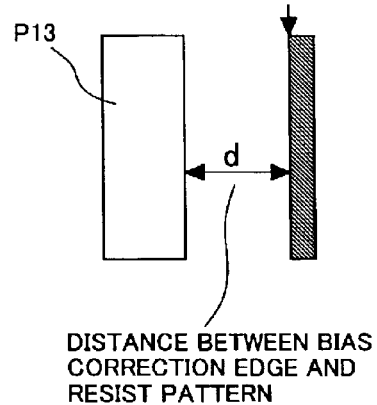

BIAS CORRECTION EDGE AT OPAQUE AREA BETWEEN SHIFTER PATTERNS

P13 d

DISTANCE BETWEEN BIAS CORRECTION EDGE AND RESIST PATTERN

FIG.14

PROXIMITY CORRECTION RELATED TO ETCHING RATE DIFFERENCE BETWEEN NMOS AND PMOS

|  | BIAS CORRECTION VALUE AT OPAQUE AREA BETWEEN SHIFTER PATTERNS |
|---|---|
| NMOS | 0nm |
| PMOS | 10nm |

BEFORE FILL UP

AFTER FILL UP

CIRCUIT DIAGRAM

LAYOUT PATTERN

LAYOUT ARRANGED NAND CELL IN UPPER CELL

PATTERNS THROUGH UPPER CELL TO LOWER CELL

PATTERNS INCLUDED IN UPPER CELL

PATTERNS INCLUDED IN LOWER CELL

LAYOUT PATTERN

CELL INCLUDING
SHIFTER PATTERN B-1

CELL INCLUDING
SHIFTER PATTERN B-3

CELL INCLUDING
SHIFTER PATTERN B-2

CELL INCLUDING
SHIFTER PATTERN B-4

LAYOUT PATTERN AND APERTURE
PATTERN FOR SHIFTER

A SHIFTER ASSIGNED
CELL C1-1 FOR CELL C1

A SHIFTER ASSIGNED
CELL C2-1 FOR CELL C2

A SHIFTER ASSIGNED
CELL C3-1 FOR CELL C3

A SHIFTER ASSIGNED
CELL C1-2 FOR CELL C1

A SHIFTER ASSIGNED
CELL C2-2 FOR CELL C2

A SHIFTER ASSIGNED
CELL C3-2 FOR CELL C3

METHOD FOR FABRICATING A SEMICONDUCTOR DEVICE

BACKGROUND OF THE INVENTION

1. Field of the Invention

The invention relates to photolithography for use in fabrication of a semiconductor device, liquid crystal panel, and so forth, and in particular, to a method of fabricating a semiconductor device by means of multiple exposures, using a phase shift mask comprising apertures allowing light rays of two phases, one and the other substantially reversed therefrom, to pass therethrough, and an opaque area, and a second mask comprising apertures allowing light rays of a single phase to pass therethrough, and an opaque area.

2. Description of the Prior Art

Photolithography for use in the formation of patterns for semiconductor integrated circuits etc. includes a multiple exposure technique through the use of a phase shift mask in order to form patterns with a resolution below the resolution limit of a common photomask comprising apertures for light rays of a single phase, and an opaque area. This technique has been disclosed in Japanese Patent Publication No. 2650962, and U.S. Pat. No. 5,858,580. That is, against layout patterns including a pattern P2 of which a fine line pattern as shown in FIG. 2A, and projected pattern accuracy are required, the pattern P2 is formed in latent image by a first exposure with a phase shift mask, and other patterns are formed in latent image by a second exposure with a second mask (referred to hereinafter as a trim mask) comprising apertures for light rays of an identical phase, and an opaque area (or a substantially opaque area), forming thereafter a resist pattern through development. In order to implement the shape of the layout pattern as shown in FIG. 2A, latent images are formed by the first exposure with the phase shift mask comprising aperture pattern P3, P4, (an out of phase pair) with a phase shift of approximately 180°, disposed in such a way as to sandwich the pattern P2 therebetween, as shown in FIG. 2B, within a wholly opaque area P1, and by the second exposure with the trim mask as shown in FIG. 2C, having opaque areas comprising a protection pattern P5 representing regions for portions of the latent image formed by the first exposure, which are to be protected, and a pattern P6 not to be formed in latent image by the first exposure.

This method, particularly application thereof to the fabrication of a transistor gate of a CMOS logic LSI, has been under extensive study, and is commonly called a phase shifter edge exposure method because a gate length pattern below the resolution limit, requiring dimensional accuracy and, fine pattern delineation is formed at an aperture edge (phase shifter edge) of a phase sift mask where phase shift becomes 180°.

In order to express 180° phase shift, respective apertures of the phase sift mask are assigned 0-degree phase or 180-degree phase hereinafter for the sake of convenience, and apertures with 0-degree phase assigned thereto are designated 0-degree shifter pattern, and apertures with 180-degree phase assigned thereto 180-degree shifter pattern. In case two apertures adjacent to each other are both the 0-degree shifter patterns or the 180-degree shifter patterns, this is referred to as a case of an identical phase (no phase shift) while in case one is the 0-degree shifter pattern, and the other is the 180-degree shifter pattern, this is referred to as a case of opposite phases or revered phases (phase shift exists). Shifter patterns prior to phase assignment are referred to as aperture patterns for phase shift patterns.

Further, an opaque width between sifters represents a distance between two sifters, in the direction of a gate length and correction of the gate length can be implemented by varying the width. Furthermore, a shifter pattern width is a dimension of a shifter pattern, in the direction of the gate length, and a protection pattern width is a width of a protection pattern, in the direction identical to that for the shifter pattern width.

A method of automatically generating the phase sift mask and trim mask as described above from design layout data has been disclosed in Japanese Patent Publication No. 3148770, and U.S. Pat. No. 5,858,580. Japanese Patent Publication No. 3148770, and U.S. Pat. No. 5,858,580 describes that a fine pattern which is imaged with respective shifter edges is extracted, division into regions where shifter patterns are disposed and other areas is made, and a 0-degree shifter pattern and a 180-degree shifter pattern are generated on both sides of the respective fine patterns as extracted.

Further, there can be cases where dimensions of resist patterns which should be identical in dimension undergo variation depending on a shifter pattern width or dimensional difference occurs to the gate patterns at the time of etching gate material depending on inconsistency in density of the resist patterns. Deformation and dimensional variation in a photolithography process are generally called an optical proximity effect, however, herein a proximity effect is meant to include pattern deformation and dimensional variation as well, taking place in an etching process. There is available proximity effect correction as a method of causing the shape of a layout pattern to be varied in advance in order to cope with the pattern deformation and dimensional variation, caused by the proximity effect. The proximity effect correction by the phase shifter edge exposure method, in particular, is described in Proceedings of SIPE, Vol. 3873 (1999), pp. 277–287, and Proceedings of SIPE, Vol. 4000 (2000), pp. 1062–1069.

SUMMARY OF THE INVENTION

In Japanese Patent Publication No. 3148770, and U.S. Pat. No. 5,858,580, no consideration is given to phases of shifter patterns having no fine patterns which are imaged with shifter edges in-between upon generation of the shifter patterns. For example, there are cases where adjacent shifter patterns will have an identical phase at spots without a pattern P2 therebetween as shown in FIG. 3B. However, when comparing results of exposure with a mask of irregular phase assignment as shown in FIG. 3B with results of exposure with a mask with 0-degree phase assigned shifter pattern and 180-degree phase assigned shifter pattern, alternately aligned as shown in FIG. 1B, it is found that a dimension of a pattern P2 which is imaged with a shifter edge in the former case differs from the same in the latter case. As a result, fluctuation in dimension within a chip increases. For example, assuming that a width of a fine pattern, which is imaged with a shifter edge, is 120 nm, and a shifter pattern width is 500 nm, dependency of a shifter edge dimension after exposure with a phase shift mask and development on a focus position is as shown in FIG. 23. FIG. 23 shows that there is deviation between a focus center position of a phase shift mask of periodic phase assignment with 0-degree phase assigned shifter pattern and 180-degree phase assigned shifter pattern, alternately aligned as shown in FIG. 1B, and a focus center position of a phase shift mask of non-periodic phase assignment as shown in FIG. 3B. If mixture of two areas, periodic phase assignment area and non-periodic phase assignment area, exists within a chip, a common focus region enabling a pattern within a desired dimension, 120 nm±10 nm, to be generated becomes extremely small. The greater aberration of an exposure system, the more pronounced this phenomenon becomes.

Further, in Japanese Patent Publication No. 3148770, and U.S. Pat. No. 5,858,580, placement of shifter patterns is limited to both sides of a fine pattern which is imaged with a shifter edge. For this reason, there occurs a difference between a dimension of a pattern which is imaged with a shifter edge positioned at the center of a region R1 where shifter patterns are periodically placed a shown in FIG. 4, and a dimension of a pattern which is imaged with a shifter edge positioned in a region R2 where only a pair of shifter patterns with mutually opposite phases assigned thereto, respectively, are placed. This problem has not been described therein. For example, FIG. 24 shows dependency of a shifter edge dimension on a focus position in the case of periodic phase placement of a fine pattern width (120 nm) and a shifter pattern width (500 nm) as in FIG. 23 and in the case of isolated placement thereof. As with the case of FIG. 23, there is deviation in the focus center position so that the common focus region enabling a pattern within a desired dimension, 120 nm±10 nm, to be generated becomes extremely small.

Further, no particular description has been given as to sequence of a step of implementing phase assignment in generation of phase shift mask data, and a step of correcting proximity effect for double exposures of shifter edges and an etching process. Accordingly, hierarchical designated layout data as designed is expanded flatly in any of processing for the above steps, raising a risk of considerable increase in data volume and processing time.

Further, because of occurrence of small patterns within the mask data created, erroneous detection results at the time of inspection for defects, causing a problem in that highly accurate inspection becomes difficult to conduct.

As for proximity effect correction in Proceedings of SIPE, Vol. 3873 (1999), pp. 277–287, and Proceedings of SIPE, Vol. 4000 (2000), pp. 1062–1069, no description has been given to correction corresponding to a protection pattern width in the trim mask.

It is therefore a first object of the invention to provide a method of fabricating a semiconductor device, capable of forming fine patterns with high accuracy by means of multiple exposures, utilizing shifter edges. It is a second object of the invention to provide a method of fabricating a semiconductor device at low cost, enabling phase assignment and optical proximity effect correction to be implemented at high speed.

It is a third object of the invention to provide a method of fabricating a semiconductor device with high accuracy and high yield, allowing highly accurate inspection for mask defects by generating data for a trim mask containing no pattern smaller than defect detect limitation.

Further, it is a fourth object of the invention to provide a method of fabricating a semiconductor device, capable of forming fine patterns with high accuracy by implementing proximity effect correction for a phase shift mask with high accuracy.

Typical embodiments of the invention under the present application are summed up as follows.

The first object can be achieved by assigning phases mutually opposite to each other to all shifter patterns adjacent to each other within a given distance from respective fine line patterns which are generated in latent image with shifter edges, in the direction perpendicular thereto, respectively. The first object is preferably achieved by providing at least four shifter patterns (two shifter patterns on respective sides of the respective fine line patterns), and executing phase assignment such that adjacent shifter patterns have mutually opposed phases without exception, respectively, In order to create shifter pattern data for assigning phases opposite to each other to the adjacent shifter patterns, respectively, without exception, a dummy pattern is generated in space between aperture patterns for shifter patterns, where a pattern to be formed at a shifter edge does not exist, by use of the existing tool for creation of a phase shift mask, having the function that a pair of shifter patterns with mutually opposite phases assigned thereto are generated on both sides of a pattern formed at a shifter edge, and phase assignment is executed such that aperture patterns for shifter patterns placed on both sides of the dummy pattern also have mutually opposed phases, respectively, thereby achieving the object (the dummy pattern is hereinafter referred to as a dummy gate pattern, meaning a dummy pattern in that although a latent image thereof is formed by exposure with the phase shift mask, it will not be left out after subsequent exposure with the trim mask, and the word "gate" has no particular meaning). Further, by use of the existing tool for creation of a phase shift mask, data for first aperture patterns for shifter patterns are created on both sides of a fine line pattern, and subsequently, if a distance from a side of the first aperture pattern for the shifter pattern, opposite from the fine line pattern, up to a circuit pattern made up of a layer of material identical to that for the fine line pattern is sufficiently long, second aperture patterns for shifter patterns (aperture patterns for dummy shifter patterns) are generated, whereupon the dummy gate pattern is created between the first aperture pattern for the shifter pattern and the second aperture pattern for the shifter pattern, and phase assignment is executed such that the first aperture pattern for the shifter pattern and the second aperture pattern for the shifter pattern, adjacent to each other, with the fine line pattern and the dummy gate pattern, interposed therebetween, will have mutually opposite phases, respectively, thereby achieving the object. Creation of the dummy gate pattern described above eliminates the necessity of newly developing a special program requiring a number of steps for development, and by inputting the dummy gate pattern into the existing tool for creation of a phase shift mask, it is possible to cause adjacent apertures of a phase shift mask to have mutually opposite phases, respectively, without exception, and to create not less than two shifter patterns on both sides of a isolated fine line pattern, respectively, such that adjacent shifter patterns have mutually opposite phases, respectively, without exception.

The second object is achieved by parallel execution of optical proximity effect correction and phase assignment as necessary, enabling partially hierarchical processing.

Further, the third object is achieved by creation of a trim mask such that a small pattern generated between the protection pattern and a pattern created with a trim mask of the layout data may be filled up as the opaque area of the trim mask or a portion of the protection pattern may deleted, depending on the dimension of the small pattern. The fourth object is achieved by correcting a width of an opaque area between shifters of the phase shift mask so as to correspond to a width of the protection pattern of the trim mask.

BRIEF DESCRIPTION OF THE DRAWINGS

FIG. 3 is a schematic plan view for illustrating a phase shift mask in the case where adjacent shifters without a pattern which is imaged with a shifter edge, interposed therebetween, come to have the same phase, FIG. 3A showing layout patterns, FIG. 3B phase-shift patterns, and FIG. 3C trim patterns;

FIG. 4 is a schematic plan view of patterns for illustrating shifter patterns against dense patterns, and shifter patterns against isolated patterns;

FIG. 11 is a view for illustrating dimensions for correction of a proximity effect due to exposure with a phase shift mask;

FIG. 12 is a view for illustrating dimensions for correction of a proximity effect due to exposure with a trim mask;

FIG. 13 is a view for illustrating dimensions for correction of a proximity effect due to a micro-loading effect in etching,;

FIG. 14 is a view for illustrating dimensions for correction of a proximity effect due to difference in etching rate between NMOS and PMOS;

DETAILED DESCRIPTION OF THE PREFERRED EMBODIMENTS

First Embodiment

With the present embodiment, there is described a case of periodically disposing phase shift patterns taking an example of a gate layer of a NAND cell.

Figure 25A:
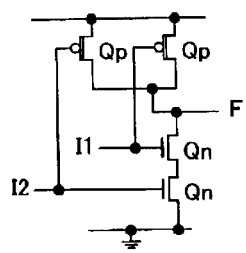
FIG. 25 is a view showing a NAND cell, FIG. 25A showing a circuit diagram, FIG. 25B layout pattern, and FIG. 25C layout of the NAND cell placed in an upper cell.
Figure 25B:
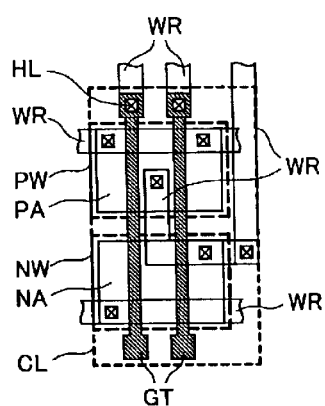
Figure 25C:
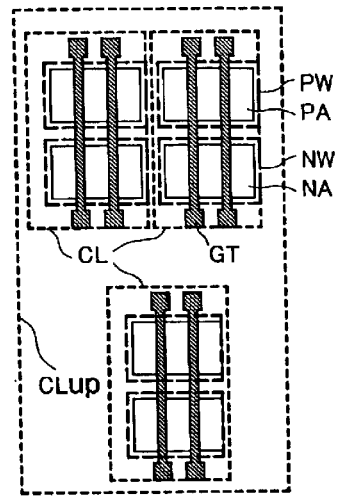

A layout pattern of a NAND cell, shown in FIG. 25B, has a gate pitch of 500 nm, and a gate width of 100 nm. As shown in FIG. 25C (only patterns of active layer and patterns of the gate layer, and the boundary of the cell are shown), these cells CL are disposed in an upper cell CLup. In an upper region of the upper cell CLup, two of the cells CL are disposed so as to be apart from each other by one pitch between gate, and in a lower region thereof, one of the cells CL is disposed without patterns of the gate layer, disposed on the periphery thereof.

Figure 23:
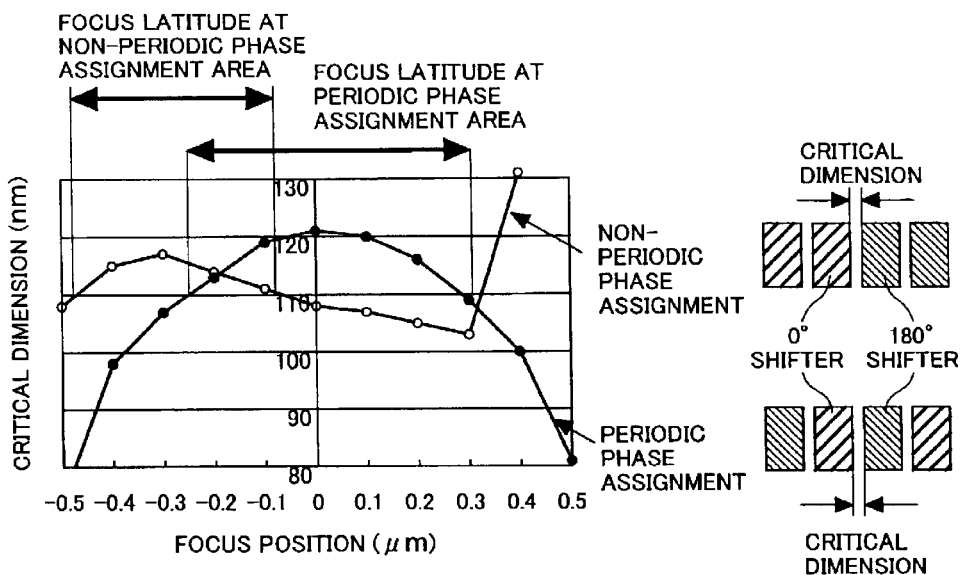
FIG. 23 is a graph showing dependency of pattern dimension of shifter patterns with periodic phase assignment and non-periodic phase assignment, due to exposure with a phase shift mask, on a focus position.
Figure 24:
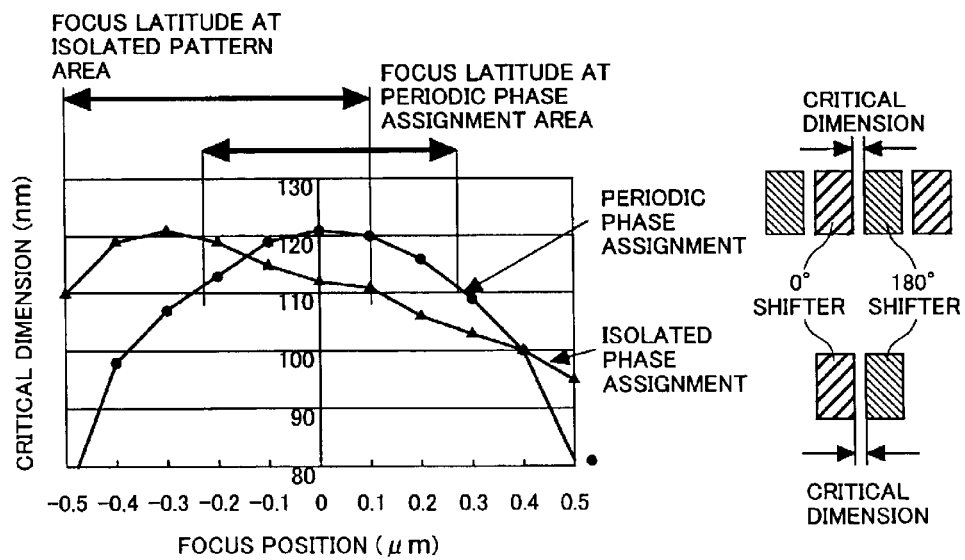
FIG. 24 is a graph showing dependency of pattern dimension of shifter patterns with periodic phase assignment and isolated phase assignment, due to exposure with a phase shift mask, on a focus position.
Figure 26A:
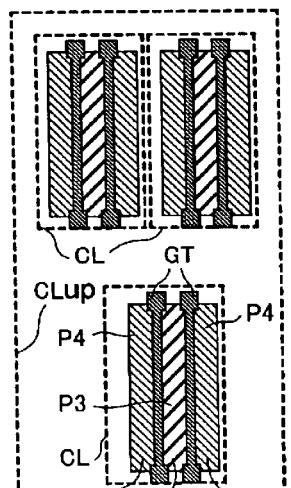
FIG. 26 is a schematic plan view showing layout patterns when shifter patterns are placed inside the NAND cell, and patterns contained in respective cells.
Figure 26B:
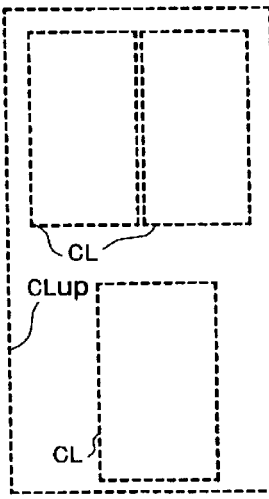
Figure 26C:
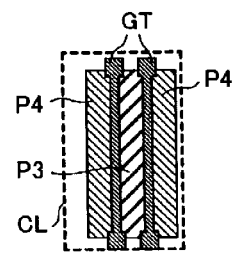
Figure 27:
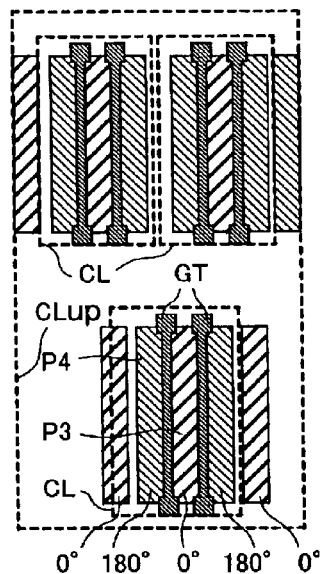
FIG. 27 is a schematic plan view of patterns showing a case where phase assignment is implemented such that adjacent shifter patterns have mutually opposed phases, respectively, without exception.

Upon generation of a shifter pattern 400 nm in width in order to form a 100 nm gate portion of the upper cell CLup, in latent image with a shifter edge, shifter patterns are generally disposed in the NAND cell CL that is a lower cell as shown in FIG. 26, thereby reducing a data volume. In this case, however, because the shifter patterns of an identical phase are arranged in a line between the NAND cells, there occurs reduction in focus latitude as shown FIG. 23. Accordingly, as shown in FIG. 27, phase assignment is executed such that the phase of shifter patterns, within a given range (in this case, within 1000 nm) from patterns which are imaged with respective shifter edges, undergo periodical variation. That is, phase assignment is executed such that even in case where there exists no pattern which is imaged with a shifter edge between two adjacent shifter patterns, the respective phases of the adjacent shifter patterns become opposite to each other. This is because shifter patterns existing within a range of about 1000 nm in the direction of the width of fine patterns centering on a fine pattern of interest will have effects on projection dimension of the fine patterns depending on the respective phases of the shifter patterns. Determination on a range up to what distance away from the fine pattern of interest, within which shifter patterns should be taken into consideration, depends on accuracy required of the fine patterns, however, it is normally preferable to take into consideration patterns within a range of about 2×w1/NA or 3×w1/NA where w1=a wavelength of exposure light, and NA=numerical aperture of an exposure system.

Figure 28A:
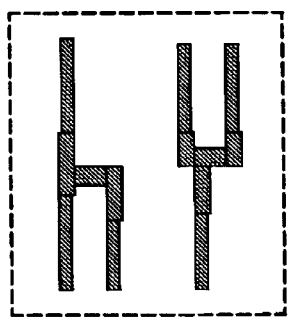
FIG. 28 is a schematic plan view of patterns for illustrating cell variation when plural cells with different shifter placement are generated against one cell, FIG. 28A showing layout patterns, FIG. 28B a shifter placement cell B-1, FIG. 28C a shifter placement cell B-2, FIG. 28D a shifter placement cell B-3, and FIG. 28E a shifter placement cell B-4.
Figure 28B:
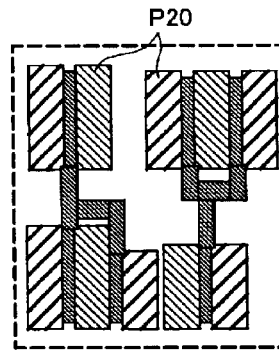
Figure 28D:
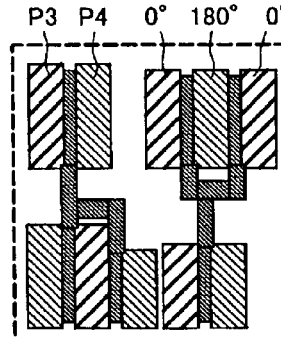
Figure 28C:
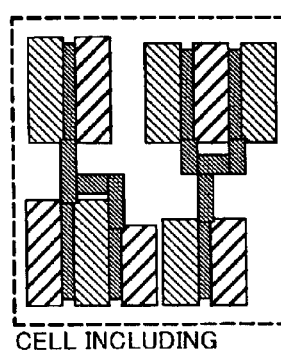
Figure 28E:
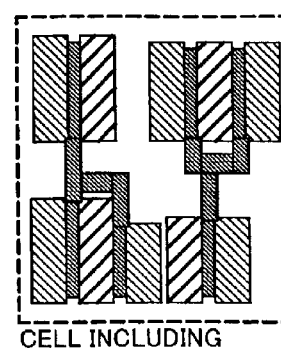

Further, dummy shifter patterns are disposed such that respective patterns which are imaged with respective shifter edges are sandwiched without exception by not less than two shifter patterns with periodical phase assignment, disposed on both sides of the respective patterns. As a shifter placement DA (Design Automation) method for automatic generation of such shifter patterns as described, it is conceivable to assign a 0-degree phase and 180-degree phase, alternately, to each of adjacent shifter patterns within a predetermined distance from an optional position (for example, the lower left corner, and so forth) of layout data. This method involves massive processing time and data volume, however, can be programmed with a relatively simple algorithm. Further, as another method, it is conceivable to prepare NAND cells with phase assignment of shifters, completely reversed, and to employ one of two NAND cells, depending on the phase of adjacent phase-shift patterns. Although this method requires complex processing with reference to units on the basis of which cells with opposite phase assignment are generated, and cell placement, significant compression of data volume in comparison with the previously described sequential placement can be attempted. For example, in the case of patterns being laid out in a cell B as shown in FIG. 28A, at least four varieties of cells (refer to FIGS. 28B, 28C, 28D, and 28E) are conceivable, depending on the phase of shifter patterns of a cell disposed alongside the cell B, and cells with different shifter placement are caused to be created as necessary. Assuming that the number of sets of shifter patterns, wherein if the phase of one shifter pattern is established, the phases of other shifter patterns are uniquely established, is n, variation of cells with shifter placement becomes $2^n$. In order to eliminate contradiction of phase assignment in the whole layout, a pair of shifter patterns sufficiently apart from each other such as a shifter pattern pair P20 is preferably treated as other than an object for regular phase assignment. In such a case, n=3 results, and variation of cells with different phase assignments to shifter patterns becomes 8.

Figure 29A:
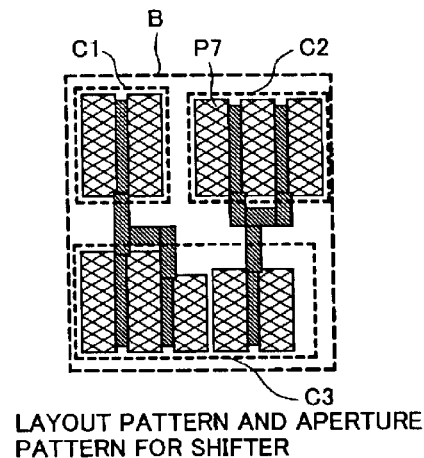
FIG. 29 is a schematic plan view of patterns for illustrating a case where shifter placement cells are generated by the unit on which shifter placement is uniquely established against one cell, FIG. 29A showing layout patterns and aperture patterns for phase shift patterns, FIG. 29B shifter placement cell C1-1 to cell C1, FIG. 29C shifter placement cell C1-2 to cell C1, FIG. 29D shifter placement cell C2-1 to cell C2, FIG. 29E shifter placement cell C2-2 to cell C2, FIG. 29F shifter placement cell C3-1 to cell C3, and FIG. 29G shifter placement cell C3-2 to cell C3.
Figure 29B:
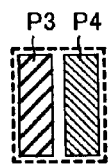
Figure 29D:
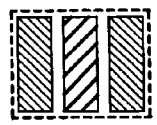
Figure 29F:
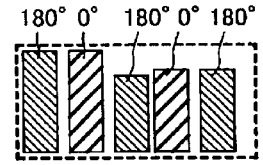
Figure 29C:
Figure 29E:
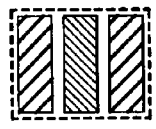
Figure 29G:
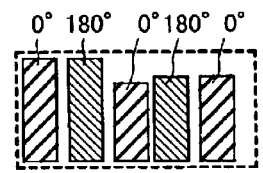

With still another method, cells made up of a set of shifter patterns, wherein if the phase of one shifter pattern is established in one cell at the lowest level, the phases of other shifter patterns are uniquely established, are newly created, and two kinds of cells with phase assignment being reversed by the cell are prepared, thereby executing cell placement. For example, in the case of a layout shown in FIG. 28A, a group of sets of aperture patterns for phase shift patterns P7 with phase assignment thereof being uniquely established once the phases of shifters adjacent thereto are established as shown in FIG. 29A is divided into three sets C1, C2, C3, and with respect to patterns of the respective sets, there are created two kinds of shifter placement cells with phase assignments opposed to each other, C1-1 and C1-2, C2-1 and C2-2, C3-1 and C3-2. Respective shifter pattern cells are selected so as to correspond to the phase of shifter patterns disposed around the original cell B, and are disposed by referring to the position of the original cell B. With this method, the shifter placement cells need to be disposed so as to be in parallel with the original cell, however, assuming that the number of sets of shifter patterns with shifters being uniquely established depending on adjacency relationship within the original cell is n, the number of cells is decreased to 2×n as compared with the above-described second method wherein the same becomes $2^n$. If the original cell is so small as to generate a pair of shifters, a data volume expressing placement positions of shifter placement cells increases, however, by expanding such a small cell into an upper cell, an increase in the data volume expressing the placement positions can be prevented.

Second Embodiment

With the present embodiment, there is described a method of generating pattern data for the periodical phase assignment, described with reference to the first embodiment, by use of an existing tool for creation of a phase shift mask.

Figure 22:
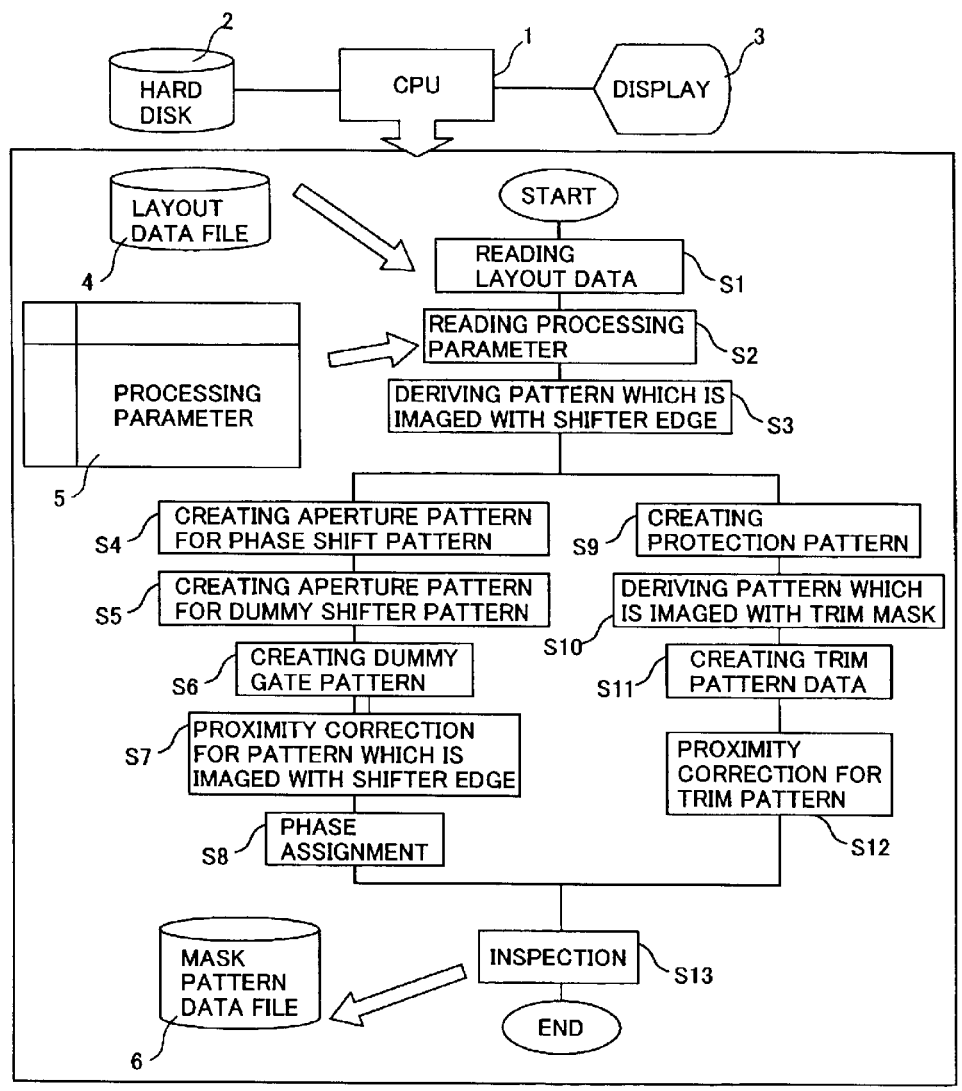
FIG. 22 is a process flow chart of a second embodiment of the invention.

With the existing tool for creation of a phase shift mask, in order to reduce a risk of occurrence of contradiction in phase assignment, shifter patterns are created by extracting only patterns that are imaged with shifter edges. FIG. 22 shows a process flow for preparing data for periodical phase assignment. There is described hereinafter a case where layout data as shown in FIG. 5 are processed according to the process flow shown in FIG. 22.

Hardware includes a CPU 1, a external memory 2, and a display 3.

Figure 1A:
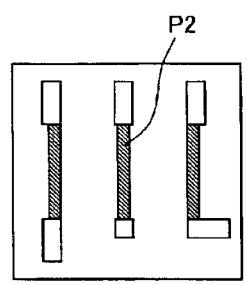
FIG. 1 is a schematic plan view for illustrating a phase shift mask in the case where phase assignment is provided such that adjacent shifters are assigned with an opposite phase, respectively, without exception, FIG. 1A showing layout patterns, FIG. 1B phase-shift patterns, and FIG. 1C trim patterns.
Figure 1B:
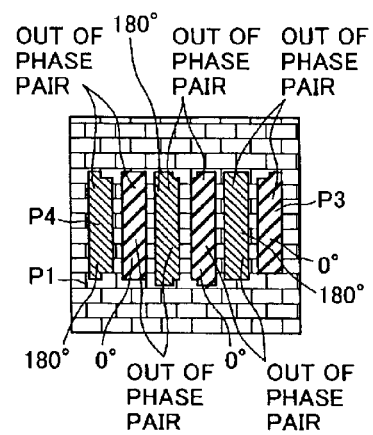
Figure 1C:
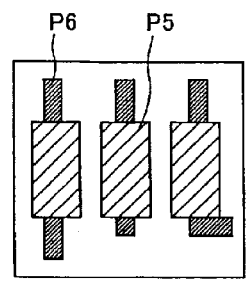
Figure 2A:
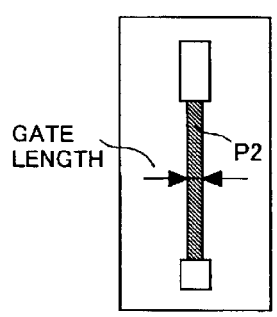
FIG. 2 is a schematic plan view of patterns for illustrating a phase shift mask and a trim mask for use in the phase shifter edge exposure method, FIG. 2A showing a layout pattern, FIG. 2B phase-shift patterns, and FIG. 2C a trim pattern.
Figure 2B:
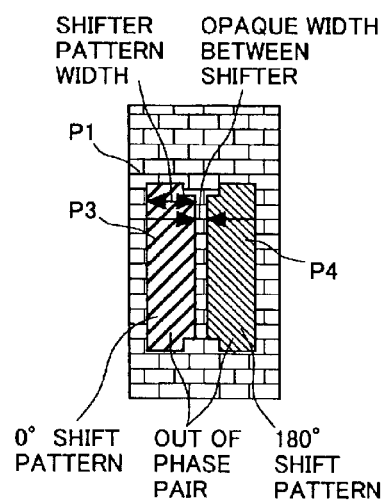
Figure 2C:
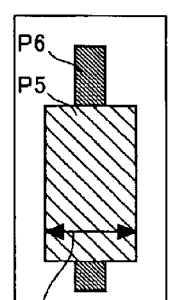
Figure 5A:
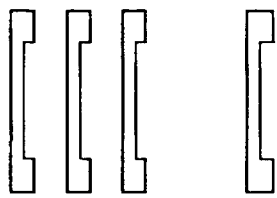
FIG. 5 is a schematic plan view of patterns for illustrating a process flow with reference to a second embodiment of the invention, FIG. 5A showing layout patterns, FIG. 5B patterns which are imaged with respective shifter edges, FIG. 5C the present aperture patterns for phase-shift, patterns FIG. 5D aperture patterns for dummy shifter pattern, FIG. 5E dummy gate patterns, FIG. 5F shifter patterns after phase assignment, FIG. 5G protection patterns, FIG. 5H patterns formed by trim patterns in design pattern, and FIG. 5I trim patterns.

First, in step S1 of reading layout data, the layout data 4 is read. The layout data as read represents patterns of a gate layer, as shown in FIG. 5A, wherein a minimum pattern dimension is 100 nm and a minimum space is 400 nm in regions on top of active regions (not shown), and up to 200 nm on the periphery thereof while both a minimum pattern dimension and a minimum space are 200 nm in other regions on top of inactive regions.

Subsequently, in step S2 of reading processing parameters, processing parameters 5 are read. The processing parameters 5 in this case specify a width 100 nm of patterns formed by the shifter edge method, a width 400 nm of a shifter pattern generated on both sides thereof, a width 350 nm of a protection pattern for protection of latent images formed with the phase shift mask, and a maximum width (the maximum value of a range of a distance between shifter apertures, needed to generate a dummy gate pattern) 400 nm of a dummy gate pattern. Further, as mask inspection rules, there are read rules providing that a minimum pattern dimension and a minimum space dimension are to be 100 nm, and that if spacing with an adjacent gate required for optical proximity effect correction is not more than 1000 nm, a gate dimension on one side is to be rendered thicker by 10 nm.

Figure 5B:
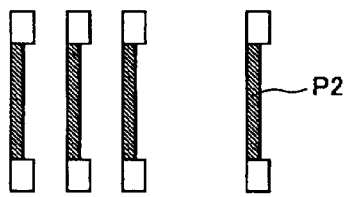
Figure 5C:
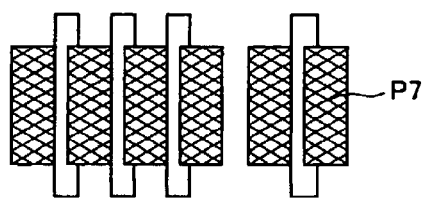
Figure 5D:
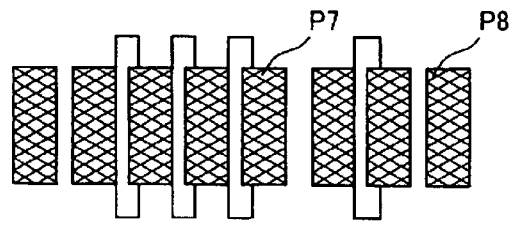

In step S3 of extracting patterns which are imaged with shifter edges, patterns P2 100 nm in width which are imaged with shifter edges are extracted as shown in FIG. 5B. In step S4 of creating aperture patterns for phase shift patterns, the aperture patterns for phase shift patterns P7 400 nm in width are formed on both sides of the respective patterns P2 as shown in FIG. 5C (Hereinafter, a pair of 0-degree and 180-degree phase assigned shifter patterns, respectively, sandwiching the respective patterns P2 therebetween, are called the present shifter patterns, and the pattern P7 prior to phase assignment is called the aperture pattern for a present phase shift pattern). Further, in step S5 of creating aperture patterns for dummy shifter patterns, aperture patterns for dummy shifter patterns P8 400 nm in width are generated so as to be apart by 100 nm from the aperture patterns for present phase shift patterns P7 in case that there does not exists a pattern formed of the same physical layer as that for the pattern P2 or the aperture patterns for present phase shift patterns P7 within a range of 600 nm on a side of the aperture patterns for present phase shift patterns P7, opposite from an adjacent pattern P2, as shown in FIG. 5D. Herein, the reason why the aperture patterns for dummy shifter patterns P8 is to be generated on condition that no pattern is present within 600 nm at the side of the aperture patterns for present phase shift patterns P7 is because the aperture patterns for dummy shifter patterns P8 with a width 400 nm, which is the same as the width of the aperture patterns for present phase shift patterns P7, can be disposed at a position apart from the aperture patterns for present phase shift patterns P7 by the width of the pattern P2 (100 nm, in this case), and a dummy shifter aperture pattern can be formed apart from other patterns (the present shifter aperture patterns and dummy shifter aperture patterns) so as to satisfy the minimum space 100 nm specified the mask inspection rules.

Figure 5E:
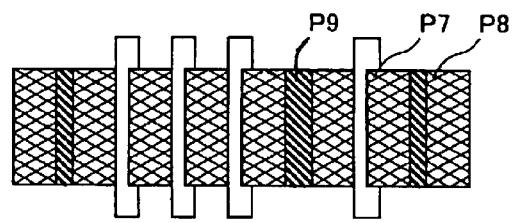
Figure 5F:
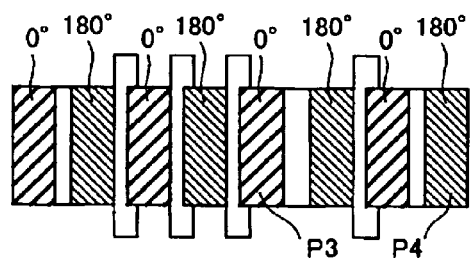
Figure 5G:
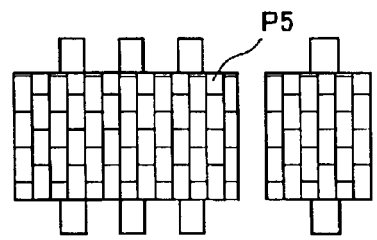
Figure 5H:
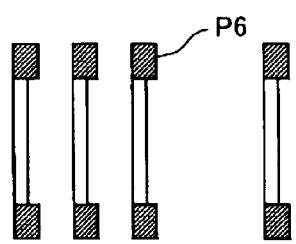
Figure 5I:
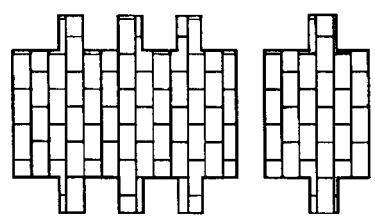

Further, in step S6 of creating dummy gate patterns, a dummy gate pattern P9 is formed at respective spots where spacing between each of the aperture patterns for present phase shift patterns P7 and each of aperture pattern for dummy shifter patterns P8 is not more than 400 nm, as shown in FIG. 5E. This is because of the need of effecting phase assignment in a later step S8 of implementing phase assignment such that the aperture patterns for present phase shift patterns P7 adjacent to each other, and the aperture patterns for dummy shifter patterns P8 adjacent to each other will have phases substantially opposite to each other, respectively. Subsequently, in step S7 of implementing proximity effect correction for patterns which are imaged with shifter edges, an edge of the respective patterns P2 is extended outward by 10 nm in case that a distance from the edge to an adjacent pattern becomes 1000 nm or more. In step S8 of implementing phase assignment for the aperture patterns for phase shift patterns, the aperture patterns for present phase shift patterns P7 and the aperture pattern for dummy shifter pattern P8 that are disposed so as to sandwich the pattern P2 after correction of the proximity effect or the dummy gate pattern P9 therebetween are assigned with phases opposite to each other, thereby obtaining 0-degree phase assigned shifter pattern P3 and 180-degree phase assigned shifter pattern P4 as shown in FIG. 5F.

Thereafter, in step S9 of creating protection patterns for protection of latent images of the patterns P2 which are imaged with shifter edges, protection patterns P5 are formed. Further, in step S10 of extracting patterns which are imaged with a trim mask, patterns P6 are extracted from input layout data by excluding the patterns P2, and trim pattern data is created from OR of the pattern P6 and the protection pattern P5, as shown FIG. 5I. In step S11 of creating trim pattern data, a trim pattern is worked on to prevent occurrence of small patterns, which will be described with reference to another embodiment of the invention. Further, in step S12 of implementing optical proximity effect correction for trim patterns, correction against the trim patterns generated is executed in accordance with the common method of implementing optical proximity effect correction.

Finally, in step S13 for inspection, with respect to both the phase shift mask and the trim mask, a minimum pattern dimension and a minimum space are inspected, and upon finding that there exists no problem therewith, the pattern data is outputted to a mask data file 6.

Further, generation, working, and inspection of all the patterns are executed by combining pattern operation programs for use in the common DRC (Design Rule Check) and so forth. Further, as for phase assignment, the software as discussed in, for example, Proceedings of SIPE, Vol. 3873 (1999), pp. 277–287, can be utilized.

In the case of processing described above, the step S5 of creating aperture patterns for dummy shifter patterns is executed, however, without this step being executed, phase assignment for the aperture patterns for present phase shift patterns P7 only may be executed through the agency of the patterns P2 and the dummy gate pattern P9. With the execution of the step S5 of creating aperture patterns for dummy shifter patterns, shifter placement similar to that for dense type fine patterns such as line and space can be implemented for isolated type fine patterns as well, so that it is possible to expand common focus latitude enabling resolution of the isolated type fine patterns and the dense type fine patterns in the same way. On the other hand, if the step S5 of creating aperture patterns for dummy shifter patterns is not executed, it is possible to reduce a volume of dummy shifter pattern data, and data for the dummy gate pattern to be generated between the aperture patterns for dummy shifter patterns, and that between the aperture pattern for a dummy shifter pattern and the aperture pattern for a present phase shift pattern, thereby enabling reduction in processing time for phase assignment, and in data volume of output shifter patterns.

Further, the step S7 of implementing proximity effect correction for patterns which are imaged with shifter edges is executed prior to the step S8 of implementing phase assignment for the aperture patterns for phase shift patterns, however, processing of the step S7 may be executed after such phase assignment or the step S7 of implementing the proximity effect correction may be omitted. In the case of executing the step S7 prior to the step S8 for the phase assignment, the phase assignment is executed while partially retaining a hierarchial structure of the layout data, so that a data volume in intermediate stages can be reduced. In the case of executing the step S7 after the step S8 for the phase assignment, correction can be implemented by taking into consideration phases assigned. Further, in the case of omitting the step S7 of implementing the proximity effect correction, processing time can be shortened.

In this case, very simple correction of the proximity effect is executed, however, more complex rules may be adopted as necessary. Correction of the optical proximity effect employing complex rules is described with reference to another embodiment. Further, there will be described later a method of executing proximity effect correction and phase assignment by making the most of a hierarchial structure of the layout data with reference to still another embodiment. Furthermore, pattern dimensions, parameters, and so forth are not to be limited to the values described in the foregoing.

Third Embodiment

Figure 6:
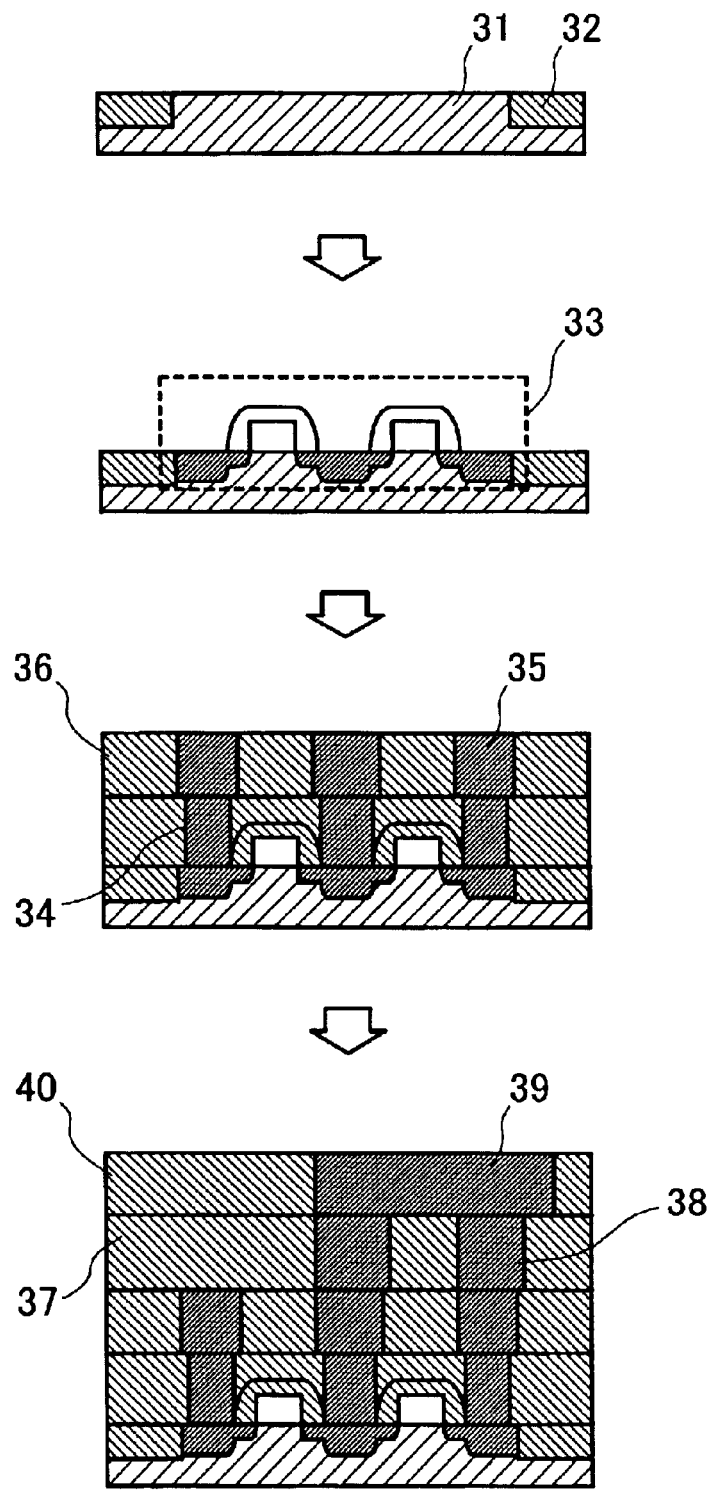
FIG. 6 is a schematic sectional view of a semiconductor device for illustrating a fabrication process according to a third embodiment of the invention.
Figure 7:
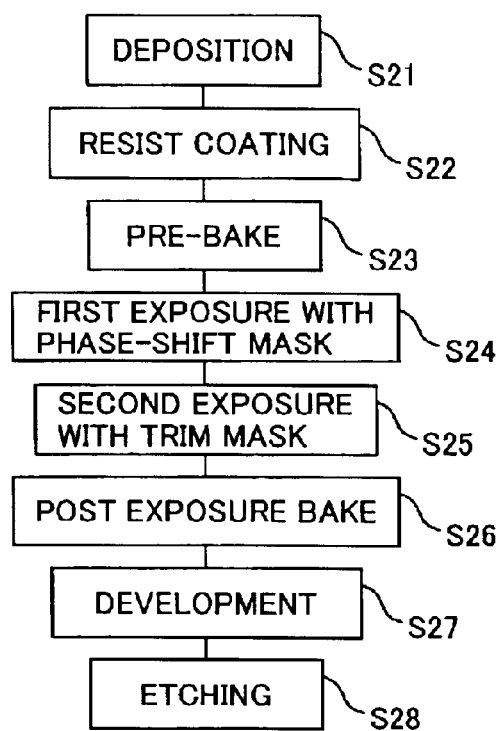
FIG. 7 is a flow chart showing a process of fabricating a device.

Now, formation of a transistor to which the invention is applied is described further in detail with reference to FIGS. 6 and 7.

FIG. 6 is a schematic sectional view for illustrating a fabrication process of the previously described semiconductor device (MOS logic LSI) by showing typical parts of the device. First, element isolation regions 32 are formed in a Si substrate (a first stage in FIG. 6), and subsequently, a MOS transistor 33 is formed (a second stage in FIG. 6), further forming contact holes 34 (a third stage in FIG. 6). Thereafter, first level wires 35 and inter-metal dielectric films 36 are formed (the third stage in FIG. 6), and on top thereof, an inter-level dielectric film 37 and via holes 38 are formed. Further, second level wires 39 and inter-metal dielectric films 40 are formed (a fourth stage in FIG. 6). Wires (not shown) on a third level or higher are formed in the same way.

Further, the formation of the transistor to which the invention is applied is described further in detail with reference to FIG. 7.

Mask pattern data for the gate of the MOS transistor 33 is generated by the same method as described in the second embodiment, and based on the mask pattern data, two masks, that is, a phase shift mask and a trim mask are fabricated. After formation of the element isolation regions 32, and formation of a gate oxide film, a polysilicon film and a $SiO_2$ film are deposited to a thickness of 100 nm, respectively, on a wafer by the CVD (Chemical Vapor Deposition) method (step S21 for deposition of a film to be worked on: FIG. 7). Subsequently, in step S22 of coating with resist, a chemically amplified positive resist for KrF excimer laser exposure is applied to the film to be worked on to a thickness of 0.4 $\mu$m by the spin coater method, and step S23 of pre-baking is executed at 100° C. for 2 minutes, thereby forming a resist layer. Next, the phase shift mask and the trim mask are set in a KrF excimer laser projection aligner, whereupon the wafer is subjected to a first exposure at a dose of 40 mJ/cm$^2$ (step S24 of the first exposure with the phase shift mask), and a second exposure at a dose of 38 mJ/cm$^2$ is applied so as to superimpose on a first exposure region on the wafer (step 25 of the second exposure with the trim mask).

Thereafter, step S26 of post-exposure baking is executed at 110° C. for 2 minutes, and step S27 of development is executed by use of a common alkaline developer, thereby obtaining a resist pattern. Subsequently, in step S28 of etching the film to be worked on, dry etching of the $SiO_2$ film and the polysilicon film with the use of the resist pattern as a mask is executed, thereby forming a gate pattern after removal of the resist.

In this case, the exposure with the phase shift mask is designated the first exposure while the exposure with the trim mask is designated the second exposure, however, on the contrary, the exposure with the trim mask may be designated a first exposure while the exposure with the phase shift mask may be designated a second exposure.

Further, film thickness, dimensions, process conditions, etc. are not limited to the above-described ones.

Thus, with the present embodiment, a semiconductor integrated circuit with a fine gate length, which has been difficult to fabricate by the conventional photo exposure method, can be fabricated with high accuracy, high yield, and high throughput.

Fourth Embodiment

With the present embodiment, there is described a case where phase assignment is carried out by setting priorities in the step S8 of implementing the phase assignment as described in the second embodiment. A method of setting priorities in the execution of the phase assignment, depending on opposing lengths of the aperture patterns for phase shift patterns to be assigned with mutually opposite phases, and so forth, has been disclosed in JP-A No. 6-308714. Herein, there is described a case where priorities are set depending on whether apertures to be assigned with phase shift are the aperture patterns for dummy shifter patterns or the aperture patterns for present phase shift patterns.

Figure 8A:
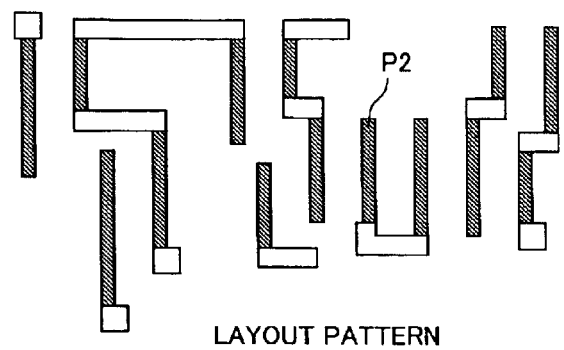
FIG. 8 is a schematic plan view of patterns for illustrating a fourth embodiment of the invention, FIG. 8A showing layout patterns, FIG. 8B the present shifter patterns, aperture patterns for dummy shifter patterns, and dummy gate patterns, and FIG. 8C shifter patterns after phase assignment.
Figure 8B:
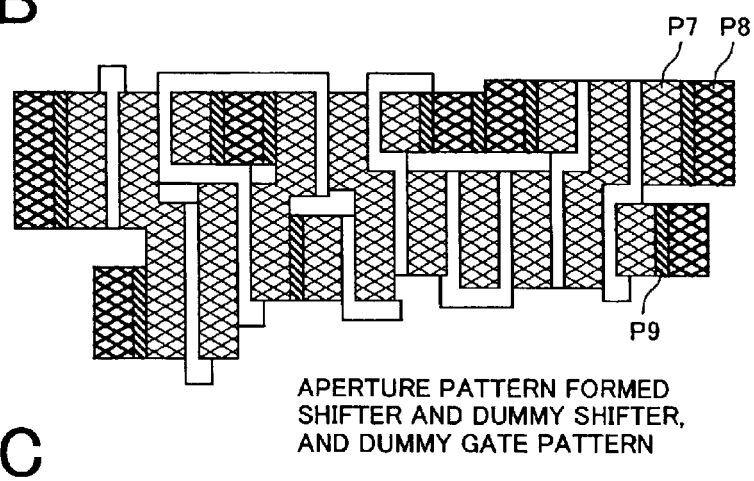

Against layout data of a gate layer with the minimum line width 100 nm as shown FIG. 8A, a pattern portion 100 nm in width is set as a pattern P2 which is imaged with a shifter edge, thereby generating the aperture patterns for present phase shift patterns P7, aperture patterns for dummy shifter patterns P8, and dummy gate patterns P9 as shown FIG. 8B. If an attempt is made in the step S8 of implementing the phase assignment such that all the aperture patterns for present phase shift patterns and the aperture patterns for dummy shifter patterns, sandwiching the respective patterns P2 and the respective dummy gate patterns P9 therebetween, are assigned with mutually opposite phases, respectively, an identical phase will be assigned to several apertures adjacent to each other (there occurs contradiction in phase assignment). Accordingly, on the basis of relationship among the patterns P2 which are imaged with shifter edges, the aperture patterns for present phase shift patterns P7, the aperture patterns for dummy shifter patterns P8, and the dummy gate patterns P9, various cases are classified as follows. As shown in FIG. 9, first priority in phase assignment is given to case (A), and cases (B), (C), and (D) are sequentially provided in order of decreasing precedence.

Figure 9A:
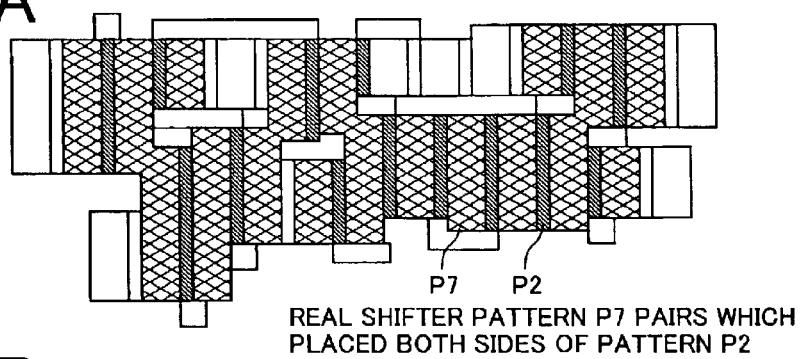
FIG. 9 is a schematic plan view of patterns for illustrating priorities in phase assignment, FIG. 9A showing a case where the respective patterns P2 are sandwiched between the present aperture patterns for present phase shift patterns P7, FIG. 9B a case where the respective dummy gate patterns P9 are sandwiched between the aperture patterns for present phase shift patterns P7, FIG. 9C a case where the respective dummy gate patterns P9 are sandwiched between the aperture pattern for a present phase shift pattern P7 and the aperture pattern for a dummy shifter pattern P8 and FIG. 9D a case where the respective dummy gate patterns P9 are sandwiched between the aperture patterns for dummy shifter patterns P8.

(A): a case where the respective patterns P2 are sandwiched between the aperture patterns for present phase shift patterns P7 (refer to FIG. 9A)

Figure 9B:
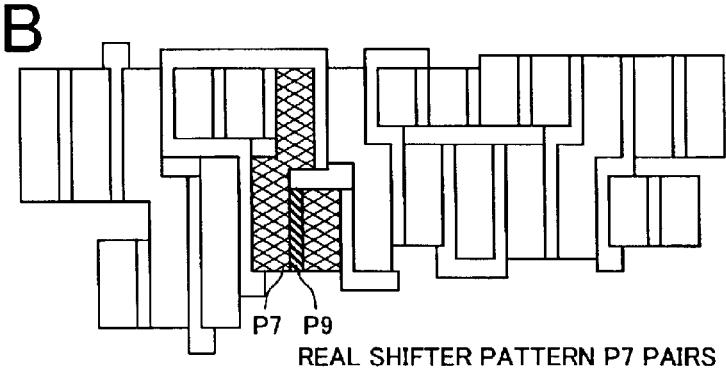

(B): a case where the respective dummy gate patterns P9 are sandwiched between the aperture patterns for present phase shift patterns P7 (refer to FIG. 9B)

Figure 9C:
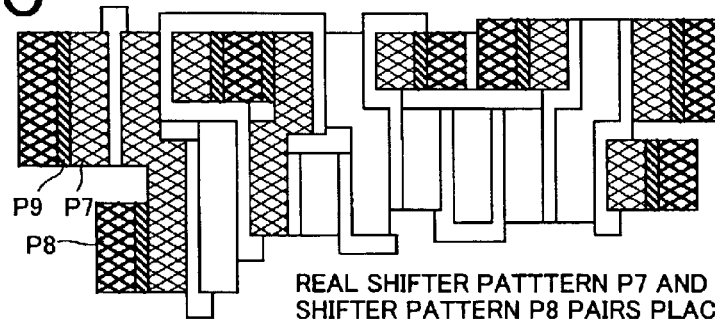

(C): a case where the respective dummy gate patterns P9 are sandwiched between the aperture pattern for a present phase shift pattern P7 and the aperture pattern for a dummy shifter pattern P8 (refer to FIG. 9C)

Figure 9D:
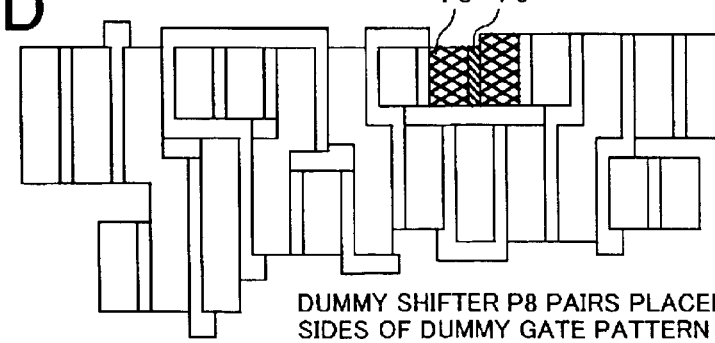

(D): a case where the respective dummy gate patterns P9 are sandwiched between the aperture patterns for dummy shifter patterns P8 (refer to FIG. 9D)

Figure 8C:
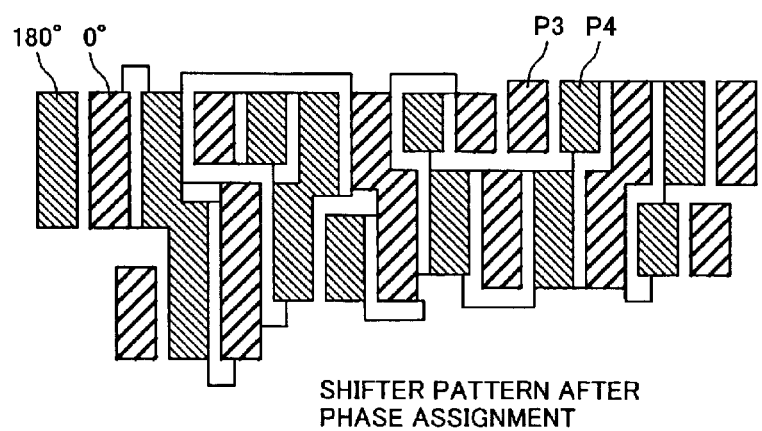

As a result, as shown in FIG. 8C, a 0-degree phase assigned shifter pattern P3 and 180-degree phase assigned shifter pattern P4 are assigned, respectively, to the present aperture patterns for phase shift patterns P7, and the aperture patterns for dummy shifter patterns P8, shown in FIG. 8B.

With this method, it is possible to fabricate a phase shift mask wherein there occurs no contradiction in phase assignment with respect to the aperture patterns for phase shift patterns with the respective patterns P2 sandwiched therebetween, minimizing degradation in pattern delineation, due to parallel alignment of apertures having an identical phase.

Fifth Embodiment

Figure 10:
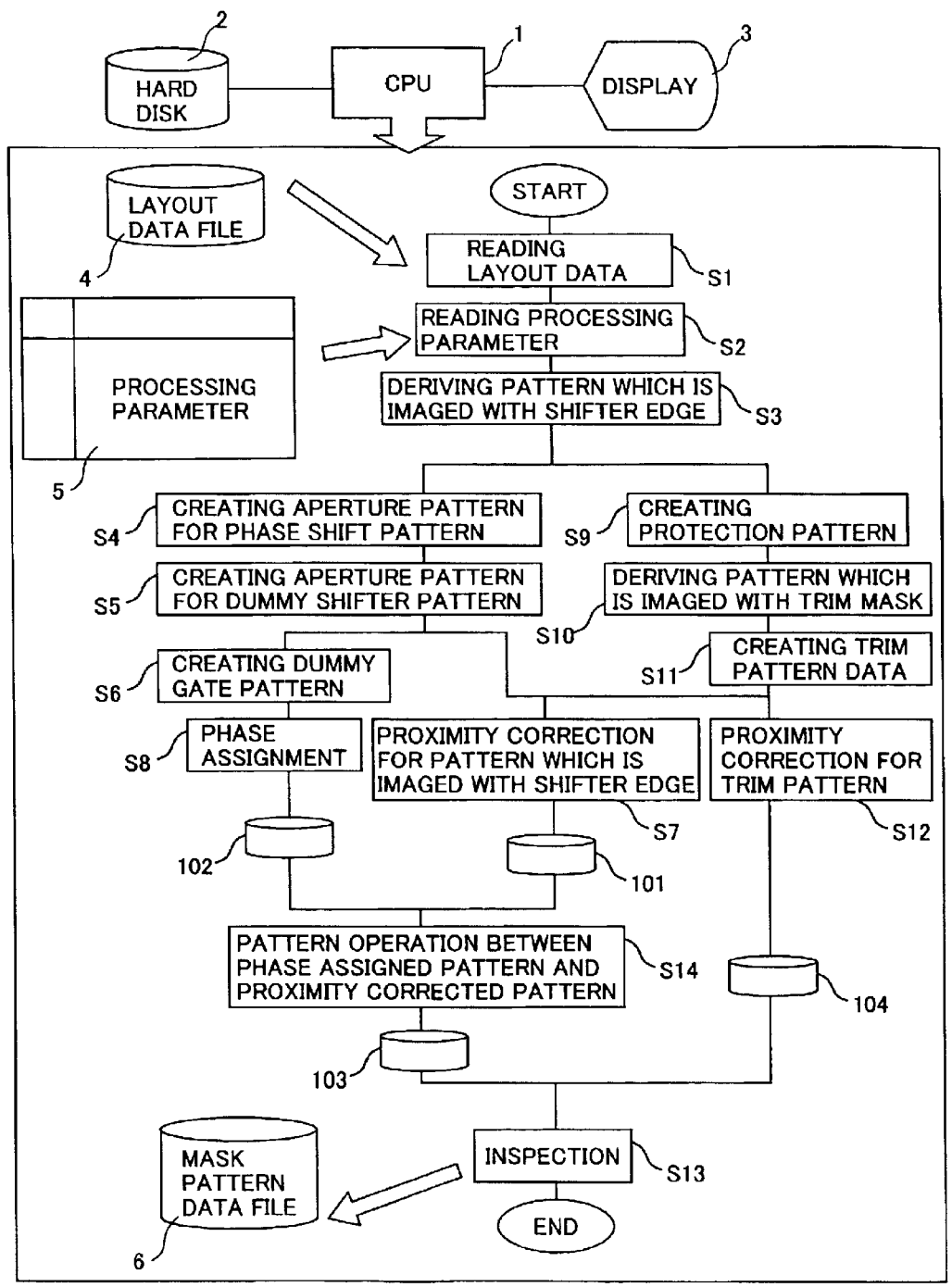
FIG. 10 is a process flow chart of a fifth embodiment of the invention.

With the present embodiment, there is described a case where proximity effect correction and phase assignment are executed in parallel with each other by referring to a process flow shown in FIG. 10.

First, in step S1 of reading layout data, gate layer patterns rendered by the same tool as described with reference to the second embodiment and a pattern layer in active regions of an NMOS and a PMOS, required for proximity effect correction, are read.

Subsequently, in step S2 of reading processing parameters, processing parameters 5 are read.

After patterns which are imaged with shifter edges, 100 nm in width, are extracted in step S3 of extracting patterns which are imaged with shifter edges, the present aperture patterns for phase shift patterns, 400 nm in width, are generated in step S4 of creating aperture patterns for phase shift patterns, and aperture patterns for dummy shifter patterns are generated in step S5 of creating aperture patterns for dummy shifter patterns.

Subsequently, in step S6 of creating dummy gate patterns, dummy gate patterns are generated, and in step S8 of implementing phase assignment, phases are assigned to shifter patterns by use of the patterns which are imaged with the shifter edges, aperture patterns for the present phase shift patterns, and the aperture patterns for dummy shifter patterns. In this connection, an opaque area width between the respective shifter patterns is made sufficiently small for the sake of convenience in data processing in later stages.

Meanwhile, in order to separately implement proximity effect correction for the shifter patterns, step S11 of creating trim pattern data is executed by way of step S9 of creating protection patterns, and step S10 of extracting patterns that are imaged with a trim mask, and further, step S7 of implementing proximity effect correction for the patterns that are imaged with the shifter edges is executed on the basis of data of the aperture patterns for phase shift patterns, aperture patterns for dummy shifter patterns, and trim patterns in accordance with a method described in another embodiment of the invention. In step S14 of pattern operation using a result of phase assignment and a result of proximity effect correction, the result 101 of proximity effect correction is subtracted in pattern operation from the result 102 of phase assignment, the result being phase shift mask pattern data 103.

Further, with respect to the trim mask as well, step S12 of implementing proximity effect correction for a common trim pattern is executed, thereby obtaining trim mask pattern data 104. Step S13 of inspection employing the normal DRC is executed with respect to the phase shift mask pattern data 103 and the trim mask pattern data 104, and upon finding that there exists no problem therewith, the data is outputted to the mask data file 6.

With the present embodiment, the present shifter patterns, the aperture patterns for dummy shifter patterns, the dummy gate patterns, and the trim pattern are created while retaining a design hierarchial data structure of data as much as possible. Accordingly, input data with respect to either phase assignment or proximity effect correction retains the hierarchial structure. Hence, the invention has an advantageous effect in terms of data processing as described hereinafter.

Figure 15:
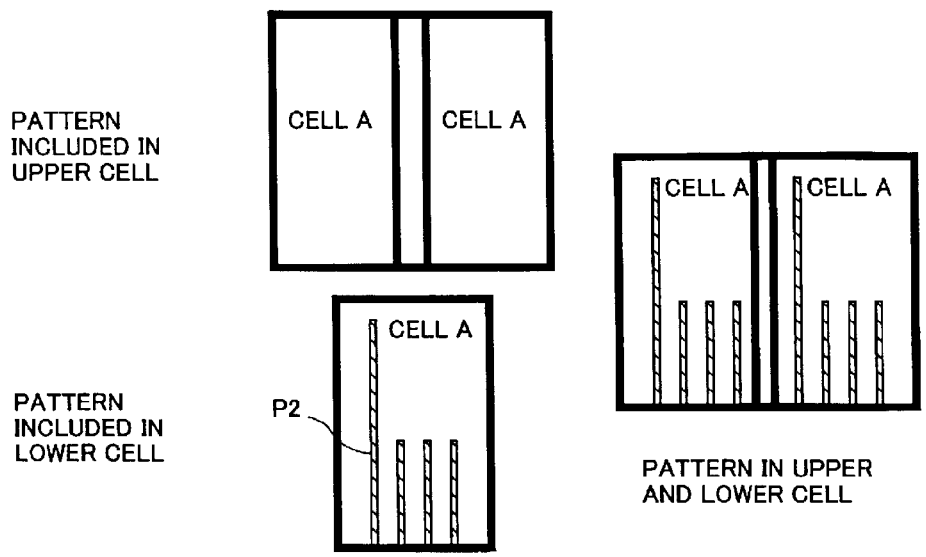
FIG. 15 is a schematic plan view of patterns showing in which level patterns formed at shifter edges are contained.
Figure 16:
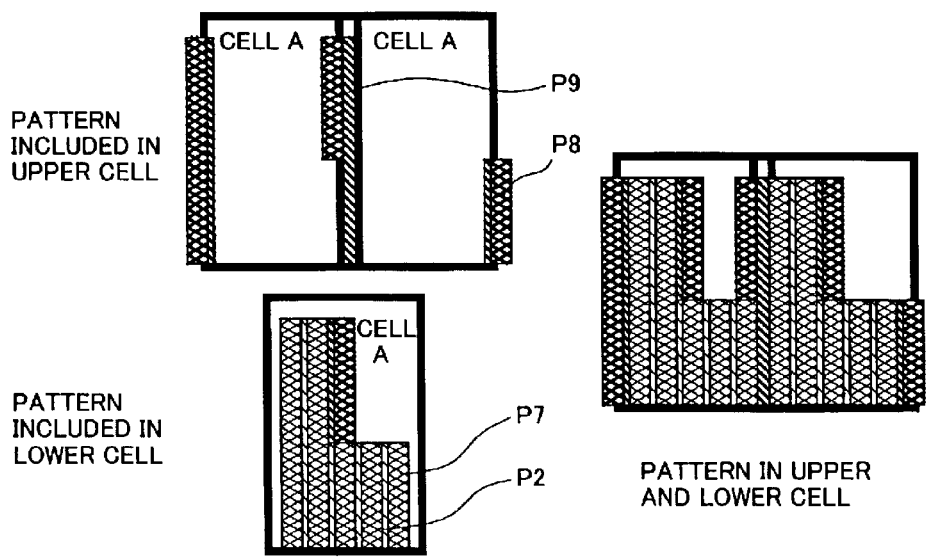
FIG. 16 is a schematic plan view of patterns showing in which level the aperture patterns for present phase shift patterns, aperture patterns for a dummy shifter patterns, and dummy gate patterns are contained, respectively.
Figure 17:
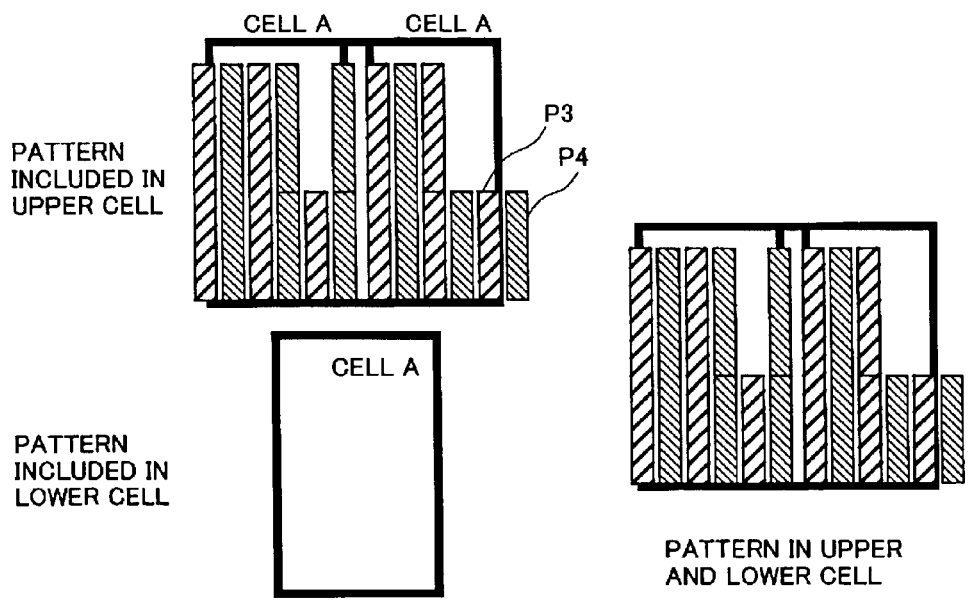
FIG. 17 is a schematic plan view of patterns showing in which level 0-degree phase assigned shifter patterns and 180-degree phase assigned shifter patterns are contained, respectively.

More specifically, if the phase shifter assignment and the proximity effect correction of the phase shift mask are separately executed as described above, this will enable parts of a layout layer, to which processing is inputted, respectively, to be rendered into a hierarchial structure. For example, layout data is conceivable wherein there exists a cell A in a lower level, including a pattern P2 that is imaged with a shifter edge as shown in FIG. 15, and there are disposed two of the cells A in an upper level on top of the lower level. Upon creation of the present aperture patterns for phase shift patterns P7, the aperture patterns for dummy shifter patterns P8, and the dummy gate patterns P9 against the layout data, those patterns generated near the boundary of the cell A enter the upper level, thereby forming a structure wherein those patterns generated against the pattern P2 near the middle of the cell A belong in the cell A as shown FIG. 16. As shown in FIG. 17, however, after phase assignment is applied to respective shifter patterns, results of the phase assignment are not confined within the cell A, and consequently, any of the aperture patterns for phase shift patterns are expanded into the upper level, resulting in an increase in the number of the patterns. As a result, it becomes extremely difficult to implement further proximity effect correction against a layout data after execution of phase shift assignment.

Figure 18:
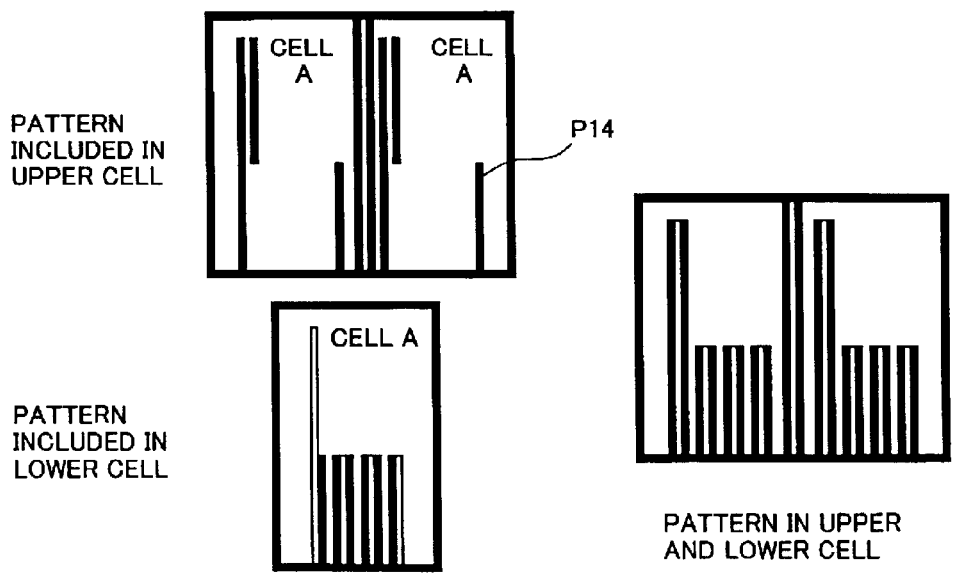
FIG. 18 is a schematic plan view of patterns showing in which level patterns provided with proximity effect correction are contained.

Meanwhile, similarly, upon execution of proximity effect correction against the layout data shown in FIG. 15, proximity effect correction patterns P14 are generated at spots where adjacent gate patterns and the aperture patterns for phase shift patterns are not confined within the cell so as to be expanded similarly to the cells in the upper level, as shown FIG. 18, still resulting in a massive volume of pattern data. Accordingly, it is also extremely difficult to implement phase assignment against layout data after the proximity effect correction.

In the case of sequentially performing processing for the phase assignment, and the proximity effect correction since the execution of the phase assignment together with the proximity effect correction results in expansion of the patterns into the upper level as described, processing will be required against massive pattern data inputted whichever processing precedes, resulting in an increase in processing time. Accordingly, as with the present embodiment, processing in parallel is desirable. Since it is known that mutually opposite phases are assigned to the aperture patterns for phase shift patterns adjacent to each other, respectively, due to placement of the phase shift patterns, utilizing the dummy gate patterns, it is possible to execute correction, dependent on exposure with a phase shift mask, described in another embodiment, in parallel with the phase assignment.

Sixth Embodiment

With the present embodiment, there is described processing for prevention of occurrence of small patterns in the step S11 of creating trim pattern data as described with reference to the second embodiment.

Figure 19A:
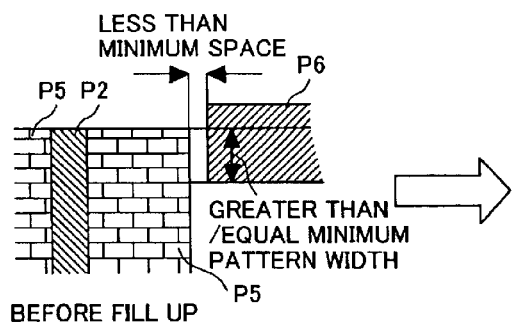
FIG. 19 is a schematic plan view showing a fill-up pattern at a spot where a small pattern has occurred.
Figure 19B:
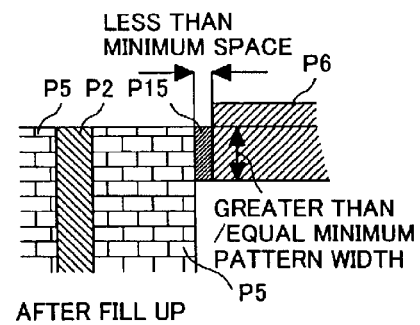

As with the second embodiment, input patterns are patterns of a gate layer, and a minimum pattern dimension is 100 nm and a minimum space is 400 nm in regions on top of active regions (not shown), and up to 200 nm on the periphery thereof, while both a minimum pattern dimension and a minimum space are 200 nm in other regions on top of inactive regions. Processing parameters specifying a shifter pattern width, a protection pattern width, and so forth are the same as those for the second embodiment, and the minimum pattern dimension and the minimum space dimension according to the mask inspection rules are set at 100 nm. According to the same process flow as that for the second embodiment, protection patterns P5 are generated. In the step S11 of creating trim pattern data, trim pattern data is created from OR of the protection pattern P5, and the pattern P6 for gate wiring over the inactive regions, whereupon there have occurred spots where spacing between the patterns P6 and the protection patterns P5 is less than the minimum space dimension according to the mask inspection rules as shown in FIGS. 19, and 20. FIG. 19A shows a case where spacing between the protection pattern P5 and the pattern P6 is less than the minimum space dimension (100 nm) according to the mask inspection rules, and a length of a portion of the space, along which both the patterns are opposed to each other, is not less than the minimum pattern width (100 nm). In such a case, a fill-up pattern P15 is created as shown in FIG. 19B. In FIG. 19B, the pattern P6 is not separated from the protection pattern P5 in the trim mask, however, a region of the fill-up pattern P15 is irradiated at the time of first exposure with the phase shift mask, so that no connection will exist between the patterns P2 and the patterns P6 in the resist pattern after double exposure, causing therefore no problem.

Figure 20A:
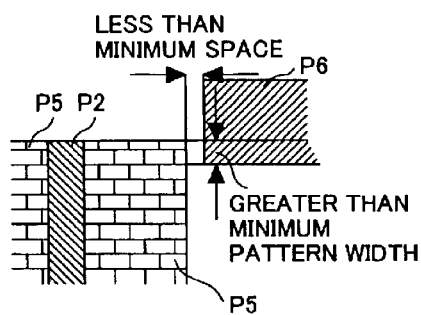
FIG. 20 is a schematic plan view showing a deletion pattern of a protection pattern at a spot where a small pattern has occurred.
Figure 20B:
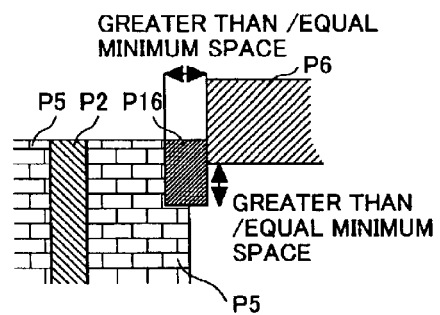

Further, FIG. 20A shows a case where spacing between the protection pattern P5 and the pattern P6 is less than the minimum space dimension (100 nm) according to the mask inspection rules, and a length of a portion of the space, along which both the patterns are opposed to each other, is less than the minimum pattern width (100 nm). In this case, if a small space is filled up, this will result in creation of a small connecting pattern, causing problems such as an erroneous detection of the same as a quasi defect at the time of inspection of a completed mask. Accordingly, as shown in FIG. 20B, there is created a deletion pattern P16 for deleting a portion of the protection pattern P5, within a range of the minimum space dimension (100 nm) according to the mask inspection rules from the pattern P6 by use of pattern operation, and by subtracting the cut-off pattern P16 from the protection pattern P5, the portion of the protection pattern P5 is cut off. Since the protection pattern P5 is created in a size more than necessary at the outset for protection of latent images generated by the first exposure, deletion of the portion thereof, on a side not in contact with a pattern which is imaged with a shifter edge, will not cause separation of patterns which should be linked with each other. Further, if correction corresponding to a distance from a gate edge to an end of a trim pattern P12 is executed (refer to FIG. 12), accuracy in dimension can be maintained. However, a cut-off pattern width is preferably rendered as small as possible as long as mask inspection is feasible.

With the use of trim pattern data created by executing fill-up and deletion with respect to the trim pattern, a mask is fabricated, whereupon it has been found that an excellent mask without any problem from an inspection point of view can be fabricated.

Further, the creation of the fill-up pattern, fill-up, creation of the cut-off pattern, deletion, and extraction of spots required for these are all implemented by automatic processing for pattern operation.

Seventh Embodiment

With the present embodiment, there is described in detail correction of optical proximity effect of the phase shift mask during the process flow described with reference to the fifth embodiment.

As a result of detailed studies conducted by the inventor et al., it has been found that the final gate length varies depending on at least four factors, namely, placement of the shifter patterns at the exposure with the phase shift mask, placement of the trim patterns at the exposure with the trim mask, micro-loading effect in etching, and gate material. Accordingly, variation in dimension, caused by the respective factors, is corrected by a procedure shown in FIG. 12.

Figure 21:
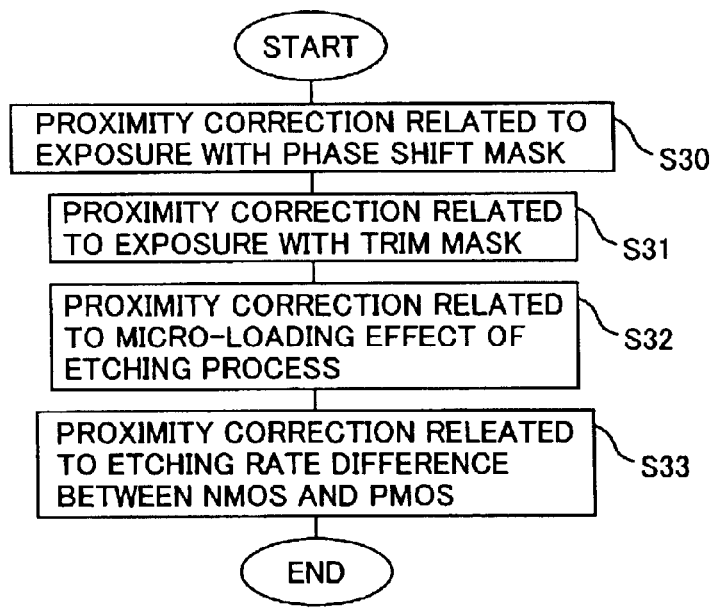
FIG. 21 is a process flow chart for proximity effect correction of patterns formed at shifter edges.

With respect to respective corrections in FIG. 21, detailed values are further shown in FIGS. 11 to 14.

More specifically:
(1) In step S30 for correction of proximity effect due to the exposure with the phase shift mask, an edge position of an opaque area between the shifter patterns is corrected depending on a width of a shifter pattern P10 in contact with the gate, and a distance up to a shifter pattern P11 adjacent to the shifter pattern P10 (refer to FIG. 11).
(2) In step S31 for correction of proximity effect due to the exposure with the trim mask, the edge position of the opaque area between the shifter patterns is corrected depending on a distance from a gate edge to the far end of a trim pattern P12 (refer to FIG. 12).
(3) In step S32 for correction of proximity effect due to the micro-loading effect in etching, the edge position of the opaque area between the shifter patterns is corrected depending on a distance up to an adjacent resist pattern P13 which is imaged after double exposure (refer to FIG. 13).
(4) In step S33 for correction of proximity effect due to difference in etching rate between NMOS and PMOS, the edge position of the opaque area between the shifter patterns is corrected in such a way as to cope with variation in dry etch rate due to dopant implanted in the gate material (refer to FIG. 14).

These four corrections are executed in the step S7 of implementing the proximity effect correction for the patterns which are imaged with the shifter edges during the process flow described with reference to the fifth embodiment.

The order in which those corrections are executed is described such that exposure process comes first, followed by an etching process, however, the sequence of those corrections may be reversed. From the viewpoint of maintaining the hierarchial structure, the step S33 for correction of the proximity effect due to difference in etching rate is preferably executed at first. Further, if results of corrections are the same as the results of the corrections described as above, sequential execution of the above-described four corrections is not necessarily required. After preparing a correction table (comparison table listing correction values against respective conditions) equivalent in effect to the case of executing the four corrections sequentially, correction en bloc may be executed with the use of the correction table. It is to be pointed out that rules (tables) shown in FIGS. 11 to 14, respectively, represent an example of conditions of the present embodiment, and respective correction values may change as appropriate.

In the case of the correction of the proximity effect due to the exposure with the phase shift mask, correction values vary depending on whether the shifter pattern P10 in contact with the gate and the shifter pattern P11 adjacent to the shifter pattern P10 have an identical phase or different phases, respectively, however, in this case, phases opposite to each other are assigned to the shifter pattern P10 and the shifter pattern P11 adjacent to the shifter pattern P10, respectively, without exception, so that a correction item corresponding to phase assignment is excluded. Accordingly, processing for phase assignment as described with reference to the fifth embodiment, and correction of proximity effect of the patterns which are imaged with the shifter edges are executed in parallel with each other.

With the invention, in the multiple exposure technique making use of shifter edges, on the basis of a fine line pattern formed in latent image with a shifter edge, periodical phase assignment for shifter patterns within a given distance from the fine line pattern in the direction vertical thereto enables the fine line pattern to be formed with high accuracy.

Further, parallel execution of optical proximity effect correction and phase assignment as necessary will enable partially hierarchial processing, so that fast correction of the proximity effect and phase assignment can be achieved.

Still further, in creating a trim mask, a small pattern created between a protection pattern and a pattern created with a trim mask of the layout data may be filled up as the opaque area of the trim mask or a portion of the protection pattern may be deleted, depending on a dimension of the small pattern, thereby enabling high accuracy and high-yield generation of patterns on which a highly accurate mask defect inspection can be conducted.

In addition, in creating the phase shift mask, by executing proximity effect correction corresponding to a width of the protection pattern of the trim mask, fine patterns can be generated with high accuracy.

What is claimed is:

1. A method of fabricating a semiconductor device comprising a step of forming circuit patterns including fine line patterns by:

preparing a first phase shift mask comprising phase shift apertures with either of two phases substantially opposite to each other, assigned thereto, respectively, and an opaque area, and a second mask comprising apertures, and an opaque area; and subjecting the first phase shift mask and the second mask, placed at a substantially identical position on a resist film on top of a semiconductor substrate, to multiple exposures including: forming latent images of the fine line patterns and one latent image of each of at least one dummy pattern on the resist film with the first phase shift mask, and then removing said latent image of said dummy pattern with the second mask thereby providing resist patterns of the latent images of the fine line patterns on the resist film, wherein the respective fine line patterns are generated in respective regions on the resist film, corresponding to respective regions sandwiched between each pair of the phase shift apertures on the first phase shift mask, with mutually opposite phases assigned thereto, respectively, and phases of all the phase shift apertures adjacent to each other within a given distance from the respective fine line patterns, in the direction perpendicular thereto, are substantially opposite to each other.

2. A method of fabricating a semiconductor device according to claim 1, wherein if a circuit pattern made up of a layer of material identical to that for the fine line patterns does not exist within the given distance, and only two or three of the phase shift apertures exist within the given distance, phase shift apertures adjacent to each other with mutually opposite phases assigned thereto, respectively, are provided on both sides of the respective fine line patterns by addition of phase shift apertures, the number of the phase shift apertures added being not less than two on one side and not less than four on both sides.

3. A method of fabricating a semiconductor device according to claim 1, wherein the given distance L is represented by L 2·wl/NA or L<3·wl /NA where a wavelength of light used for exposure is wl, and numerical aperture of a projection optical system used for exposure is NA.

4. A method of fabricating a semiconductor device according to claim 1, wherein the circuit patterns are gate layer patterns of a transistor.

5. A method of fabricating a semiconductor device according to claim 1, wherein data for the first phase shift mask and the second mask is generated from layout data of the circuit patterns, data for phase shift aperture patterns of the first phase shift mask is generated in regions including both sides of the respective fine line patterns extracted from the layout data upon generation of the data for the first phase shift mask, and in the case of the phase shift aperture patterns adjacent to each other with a distance therebetween, not more than a given value, phases are assigned to the phase shift aperture patterns, respectively, such that phases of light rays transmitting through the phase shift aperture patterns adjacent to each other are opposed to each other regardless of whether or not the respective fine line patterns are sandwiched between two of the phase shift aperture patterns adjacent to each other.

6. A method of fabricating a semiconductor device according to claim 1, wherein data is created for said dummy pattern to be generated between phase shift aperture patterns adjacent to each other with a distance therebetween, less than a given value, and phases are assigned to the phase shift aperture patterns, respectively, such that phases of light rays transmitting through the phase shift aperture patterns adjacent to each other with the respective fine line patterns and said dummy pattern, sandwiched therebetween, are opposed to each other.

7. A method of fabricating a semiconductor device according to claim 1, wherein data for the first phase shift mask and the second mask is generated from layout data of the circuit patterns, data for first aperture patterns of the first phase shift mask is generated on both sides of the respective fine line patterns extracted from the layout data upon generation of the data for the first phase shift mask, data for second aperture patterns is generated only if sufficient margin for placement exists on a side of the data for the first aperture patterns, opposite from the respective fine line patterns, and phases are assigned to the first aperture patterns and the second aperture patterns, respectively, such that phases of phase shift aperture patterns adjacent to each other, including the first and second aperture patterns, are opposed to each other.

8. A method of fabricating a semiconductor device comprising a step of forming circuit patterns including fine line patterns by:

preparing a first phase shift mask comprising phase shift apertures with either of two phases, substantially opposite to each other, assigned thereto, respectively, and an opaque area, and a second mask comprising apertures, and an opaque area; and subjecting the first phase shift mask and the second mask, placed at a substantially identical position on a resist film on top of a semiconductor substrate, to multiple exposures including: forming latent images of the fine line patterns and one latent image of each of at least one dummy pattern on the resist film with the first phase shift mask, and then removing said latent image of said dummy pattern with the second mask thereby providing resist patterns of the latent images of the fine line patterns on the resist film, wherein the respective fine line patterns are generated in respective regions on the resist film, corresponding to respective regions sandwiched between each pair of the phase shift apertures on the first phase shift mask, with mutually opposite phases assigned thereto, respectively, data for the first phase shift mask and the second mask is generated from layout data of the circuit patterns, the data for the second mask is created so as to include protection patterns for protection of the fine line patterns generated in latent image with the first phase shift mask against exposure with the second mask, and circuit other than the fine line patterns, patterns of the first phase shift mask being corrected for proximity effect based on the layout data, and the data for the first phase shift mask and the second mask while patterns of the second mask being corrected for proximity effect based on the data for the second mask.

9. A method of fabricating a semiconductor device according to claim 8, wherein proximity effect correction of the patterns of the first phase shift mask is executed so as to correspond to the property of constituent material of the circuit pattern, distances to adjacent circuit patterns in the layout data, pattern placement conditions for the patterns of the first phase shift mask, dimensions of the protection patterns in the patterns of the second mask.

10. A method of fabricating a semiconductor device according to claim 8, further comprising steps of:
   creating aperture pattern data of the first phase shift mask;
   creating phase pattern data of the first phase shift mask by providing the aperture pattern data with phase assignment;
   creating proximity effect correction pattern data of the first phase shift mask or opaque area pattern data of the first phase shift mask by providing the aperture pattern data with proximity effect correction based on the aperture pattern data, the patterns of the second mask, and the layout data; and
   generating the data for the first phase shift mask provided with phase assignment and proximity effect correction on the basis of the phase pattern data and the proximity effect correction pattern data or the opaque area pattern data.

11. A method of fabricating a semiconductor device comprising a step of forming circuit patterns including fine line patterns by:
   preparing a first phase shift mask comprising phase shift apertures with either of two phases, substantially opposite to each other, assigned thereto, respectively, and an opaque area, and a second mask comprising apertures, and an opaque area; and
   subjecting the first phase shift mask and the second mask, placed at a substantially identical position on a resist film on top of a semiconductor substrate, to multiple exposures including: forming latent images of the fine line patterns and one latent image of each of at least one dummy pattern on the resist film with the first phase shift mask, and then removing said latent image of said dummy pattern with the second mask thereby providing resist patterns of the latent images of the fine line patterns on the resist film,
   wherein if a distance between a protection pattern for protection of respective patterns generated with the first phase shift mask created from layout data and a pattern generated in latent image with the second mask is found less than a minimum space dimension permissible for mask inspection from data for the second mask, space between said two patterns is filled up with an opaque pattern provided that a length of a portion of the space, less than the minimum space dimension permissible in width, along which said two patterns are opposed to each other, is not less than a minimum space dimension permissible for the mask inspection, and part of the protection pattern, in contact with the space is deleted to an extent that the minimum space permissible for the mask inspection is secured provided that the length of the portion of the space, along which said two patterns are opposed to each other, is less than the minimum space dimension permissible for the mask inspection.

12. A method of fabricating a semiconductor device, comprising the steps of:
   (a) preparing a semiconductor substrate formed thereon a film to be worked on;
   (b) coating a photoresist film on said film to be worked on;
   (c) providing a first photomask with an opaque area having at least a first, a second, a third, and a fourth apertures arranged in sequence and isolated by line-shaped opaque portions therebetween, said line-shaped opaque portions corresponding respectively to latent images of at least a first line portion, a second line portion, and a third line portion to be formed on said film, each pair of neighboring apertures of said apertures having mutually opposed phases to each other;
   (d) forming the latent images of the first line portion, the second line portion, and the third line portion on said photoresist film by subjecting said photoresist film to the first photomask with lights passing through edges of the first, second, third, and fourth apertures;
   (e) providing a second photomask with at least one transparent area each corresponding to one of the line portions to be irradiated and at least one opaque area corresponding to the remaining line portions to be shielded;
   (f) forming resist patterns having only said line portion to be shielded by said opaque area on said photoresist film, which has been subjected to the first photomask, by subjecting said photoresist film to the second photomask with lights passing through said transparent area thereon; and
   (g) etching said film with the resist patterns thereon.

13. A method of fabricating a semiconductor device according to claim 12, wherein the first photomask has the first, second, third, and fourth apertures and a fifth aperture arranged in sequence and isolated by said line-shaped opaque portions therebetween, and said line-shaped opaque portions correspond respectively to latent images of the first line portion, the second line portion, the third line portion, and a fourth line portion to be formed on said film, and
   the first and fourth line portions are dummy gate portions, the second and third line portions are gate portions.

14. A method of fabricating a semiconductor device according to claim 12, wherein the first photomask has the first, second, third, and fourth apertures and a fifth, a sixth, a seventh, and an eighth apertures arranged in sequence and isolated by said line-shaped opaque portions therebetween, said line-shaped opaque portions correspond respectively to latent images of the first line portion, the second line portion, the third line portion, a fourth line portion, a fifth line portion, a sixth line portion, and a seventh line portion to be fanned on said film, and
   the first, fourth, seventh line portions are dummy gate portions, the second and third line portions are gate portions constituting a pair of I-th gates, and the fifth and sixth line portions are gate portions constituting a pair of II-th gates.

15. A method of fabricating a semiconductor device according to claim 12, wherein the first photomask has the first, second, third, and fourth apertures and a fifth aperture arranged in sequence and isolated by said line-shaped opaque portions therebetween, said line-shaped opaque portions correspond respectively to latent images of the first line portion, the second line portion, the third line portion, a fourth line portion, a fifth line portion, and a sixth line portion to be formed on said film, and
   the first, fourth, sixth line portions are dummy gate portions, the second and third line portions are gate portions constituting a pair gates, and the fifth line portion is a gate portion constituting a gate.

16. A method of fabricating a semiconductor device having a first, second, and third layout portion of periodic assignment, and a fourth layout portion of non-periodic assignment located parallel and adjacent thereto comprising the steps of:

(a) preparing a semiconductor substrate formed thereon a film to be worked on;

(b) coating a photoresist film on said film to be worked on;

(c) forming latent images of a first dummy layout portion, a first, a second and a third layout portions, a second dummy layout portion, a fourth layout portion, and a third dummy layout portion by subjecting said photoresist film to a first photomask, said first photomask being provided with an opaque area having a first, a second, a third, a fourth, a fifth, a sixth, a seventh, and an eighth apertures which are isolated by line-shaped opaque portions therebetween which correspond respectively to the latent images of the first dummy layout portion, the first, second and third layout portions, the second dummy layout portion, fourth layout portion, and the third dummy layout portion, each pair of the first and second apertures, the third and forth apertures, the fifth and sixth apertures, and the seventh and eighth apertures having mutually opposed phases to each other, while the first, third, fifth and seventh apertures having the same phase with one another and the second, fourth, sixth and eighth apertures having the same phase with one another;

(d) forming resist patterns having only the first, second, third, and fourth layout portions on said photoresist film, which has been subjected to the first photomask, by subjecting said photoresist film to the second photomask with lights passing through transparent areas thereon, the second photomask being provided with opaque areas corresponding to the first, second, third, and fourth layout portions to be shielded and transparent areas corresponding to the first, second, and third dummy layout portions to be irradiated; and (e) etching said film with the resist patterns thereon.

* * * * *